(12) United States Patent
Sugiyama et al.

(10) Patent No.: US 9,570,137 B2
(45) Date of Patent: Feb. 14, 2017

(54) MAGNETIC MEMORY AND SEMICONDUCTOR-INTEGRATED-CIRCUIT

(71) Applicant: Kabushiki Kaisha Toshiba, Minato-ku (JP)

(72) Inventors: Hideyuki Sugiyama, Kawasaki (JP); Tetsufumi Tanamoto, Kawasaki (JP); Mizue Ishikawa, Yokohama (JP); Tomoaki Inokuchi, Yokohama (JP); Yoshiaki Saito, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/067,586

(22) Filed: Mar. 11, 2016

(65) Prior Publication Data

US 2016/0196861 A1    Jul. 7, 2016

Related U.S. Application Data

(63) Continuation of application No. PCT/JP2014/075127, filed on Sep. 22, 2014.

(30) Foreign Application Priority Data

Sep. 24, 2013   (JP) ................................. 2013-197352

(51) Int. Cl.
*G11C 11/00* (2006.01)
*G11C 11/16* (2006.01)
(Continued)

(52) U.S. Cl.
CPC ............ *G11C 11/165* (2013.01); *G11C 11/161* (2013.01); *H01L 27/228* (2013.01); *H01L 43/08* (2013.01); *H03K 19/16* (2013.01)

(58) Field of Classification Search
CPC ........... G11C 5/025; G11C 5/04; G11C 11/16; G11C 11/15; G11C 2211/5614
(Continued)

(56) References Cited

U.S. PATENT DOCUMENTS

2009/0034320 A1    2/2009  Ueda
2009/0161414 A1*   6/2009  Ito ........................... G11C 11/15
                                                        365/158
(Continued)

FOREIGN PATENT DOCUMENTS

JP    2009-37703    2/2009
JP    2011-199064   10/2011
(Continued)

OTHER PUBLICATIONS

International Search Report issued Dec. 2, 2014 in PCT/JP2014/075127, filed Sep. 22, 2014 (with English Translation).

*Primary Examiner* — Huan Hoang
(74) *Attorney, Agent, or Firm* — Oblon, McClelland, Maier & Neustadt, L.L.P.

(57) ABSTRACT

A magnetic memory includes a magnetoresistive device and a load resistance unit. The magnetoresistive device has a first resistance state and a second resistance state and includes a first ferromagnetic layer and a second ferromagnetic layer. The load resistance unit is electrically connected to the magnetoresistive device. The load resistance unit is in a first state and a second state. Differential resistance of the load resistance unit at the second state is lower than differential resistance of the load resistance unit at the first state.

20 Claims, 20 Drawing Sheets

(51) Int. Cl.
  *H01L 43/08* (2006.01)
  *H03K 19/16* (2006.01)
  *H01L 27/22* (2006.01)
(58) Field of Classification Search
  USPC .......................................... 365/158, 171, 173
  See application file for complete search history.

(56) References Cited

U.S. PATENT DOCUMENTS

2011/0228596 A1 9/2011 Inokuchi et al.
2013/0077388 A1 3/2013 Inokuchi et al.

FOREIGN PATENT DOCUMENTS

JP   2013-73978   4/2013
WO  WO 2007/074504 A1  7/2007

\* cited by examiner

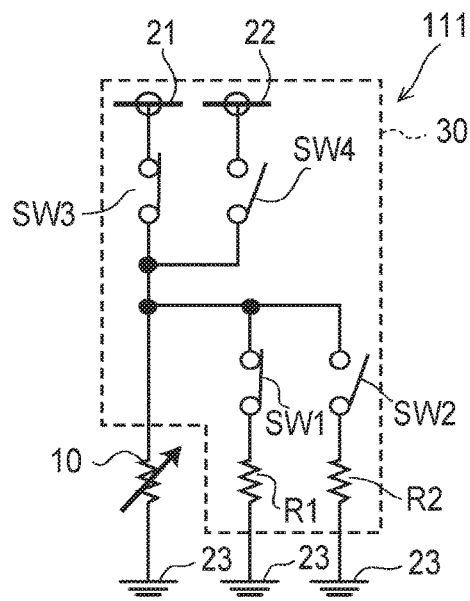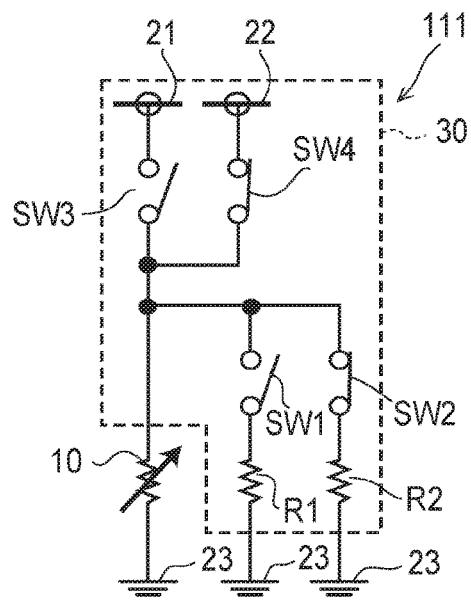
FIG. 9A  FIG. 9B
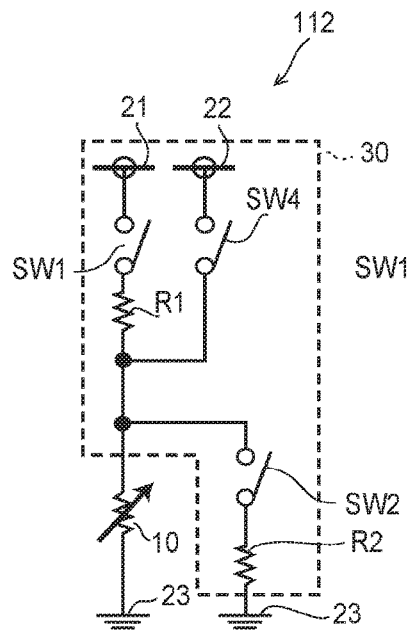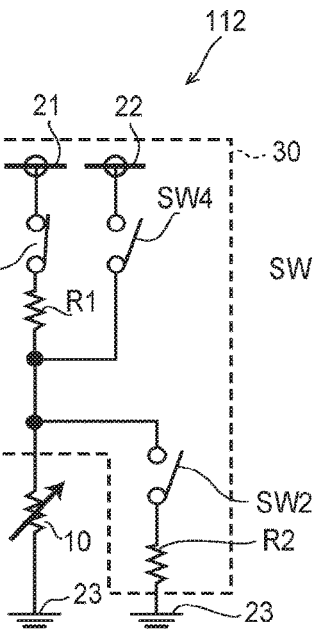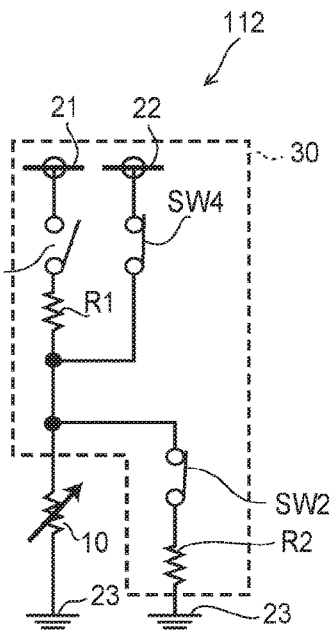
FIG. 9C  FIG. 9D  FIG. 9E

MAGNETIC MEMORY AND SEMICONDUCTOR-INTEGRATED-CIRCUIT

CROSS-REFERENCE TO RELATED APPLICATIONS

This is a continuation application of International Application PCT/JP2014/075127, filed on Sep. 22, 2014; the entire contents of which are incorporated herein by reference.

FIELD

Embodiments described herein relate generally to a magnetic memory and a semiconductor-integrated-circuit.

BACKGROUND

Magnetic random access memory (MRAM) is one type of magnetic memory. In MRAM, a magnetic tunnel junction (MTJ) device that has a tunneling magnetoresistive (TMR) effect is included in a data memory unit. Also, a semiconductor-integrated-circuit that uses a spin MOSFET in which a ferromagnet and a MOSFET are combined is known. In the case where the spin MOSFET is included in a logic gate, a reconfigurable logic circuit can be realized in which the logic gate can be modified by changing the magnetization state of the ferromagnet. Higher integration is desirable for such a magnetic memory and semiconductor-integrated-circuit.

BRIEF DESCRIPTION OF THE DRAWINGS

FIGS. 9A to 9E are circuit diagrams schematically showing magnetic memories according to the first embodiment;

DETAILED DESCRIPTION

Figure 1A:
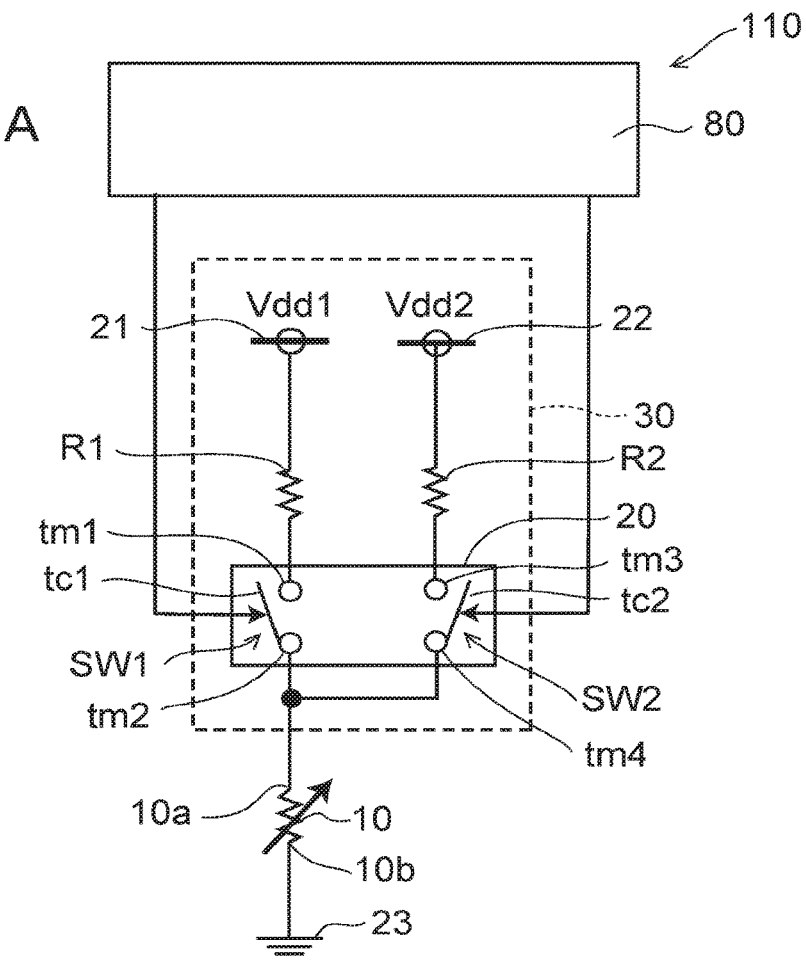
FIGS. 1A to 1C are circuit diagrams schematically showing a magnetic memory according to a first embodiment.

According to one embodiment, a magnetic memory includes a magnetoresistive device, a load resistance unit, and a controller. The magnetoresistive device has a first resistance state and a second resistance state and includes a first ferromagnetic layer and a second ferromagnetic layer. A direction of magnetization of the first ferromagnetic layer is changeable. A direction of magnetization of the second ferromagnetic layer is changeable. Resistance between the first ferromagnetic layer and the second ferromagnetic layer is higher in the second resistance state than in the first resistance state. The load resistance unit is electrically connected to the magnetoresistive device. The load resistance unit has a first state and a second state. Differential resistance of the load resistance unit at the second state is lower than differential resistance of the load resistance unit at the first state. The controller switches the magnetoresistive device to the first resistance state by current flowing in a first direction between the first ferromagnetic layer and the second ferromagnetic layer with the load resistance unit being set to the first state. The controller switches the magnetoresistive device to the second resistance state by current flowing in the first direction between the first ferromagnetic layer and the second ferromagnetic layer with the load resistance unit being set to the second state.

According to another embodiment, a semiconductor-integrated-circuit includes magnetoresistive devices, a load resistance unit, and a controller. Each of the magnetoresistive devices has a first resistance state and a second resistance state and includes a first ferromagnetic layer and a second ferromagnetic layer. A direction of magnetization of the first ferromagnetic layer is changeable. A direction of magnetization of the second ferromagnetic layer is changeable. Resistance between the first ferromagnetic layer and the second ferromagnetic layer is higher in the second resistance state than in the first resistance state. The load resistance unit is electrically connected to at least one of the magnetoresistive devices. The load resistance unit has a first state and a second state. Differential resistance of the second state is lower than differential resistance of the first state.

The controller switches the at least one of the magnetoresistive devices to the first resistance state by current flowing in a first direction between the first ferromagnetic layer and the second ferromagnetic layer with the load resistance unit being set to the first state. The controller switches the at least one of the magnetoresistive devices to the second resistance state by current flowing in the first direction between the first ferromagnetic layer and the second ferromagnetic layer with the load resistance unit being set to the second state.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, there are also cases where the dimensions and/or the proportions are illustrated differently between the drawings, even in the case where the same portion is illustrated.

In the drawings and the specification of the application, components similar to those described in regard to a drawing thereinabove are marked with like reference numerals, and a detailed description is omitted as appropriate.

First Embodiment

Figure 1B:
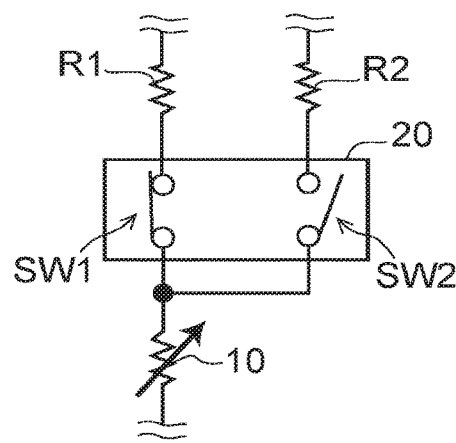
Figure 1C:
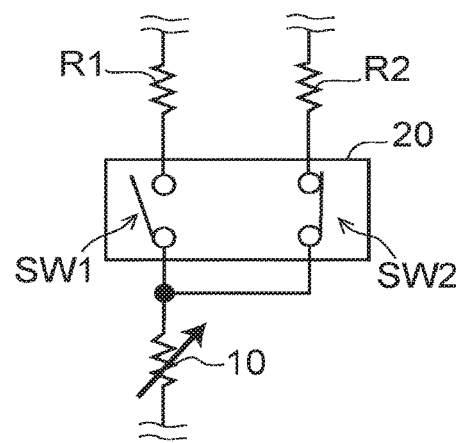

FIG. 1A to FIG. 1C are circuit diagrams schematically showing a magnetic memory according to a first embodiment.

As shown in FIG. 1A to FIG. 1C, the magnetic memory 110 includes a magnetoresistive device 10 and a load resistance unit 30. The magnetoresistive device 10 includes at least two free magnetic layers; and the resistance value of the magnetoresistive device 10 changes according to the orientations of the magnetizations of the free magnetic layers. The load resistance unit 30 is electrically connected to the magnetoresistive device 10. The load resistance unit 30 is a load resistance for the magnetoresistive device 10. The load resistance unit 30 changes the differential resistance. Thereby, the load resistance unit 30 adjusts the current flowing in the magnetoresistive device 10.

The load resistance unit 30 is in a first state or in a second state. As in FIG. 1B, the first state is the state in which a first resistance device R1 is connected in series with the magnetoresistive device 10. As in FIG. 1C, the second state is the state in which a second resistance device R2 is connected in series with the magnetoresistive device 10.

The differential resistance of the load resistance at the second state is lower than the differential resistance of the load resistance at the first state. Here, "differential resistance" is the proportion (dV/dI) of the change of the voltage (dV) with respect to the infinitesimal change of the current (dI). Hereinbelow, the differential resistance is described as dV/dI=RL.

The magnetic memory 110 includes a controller 80. The controller 80 is electrically connected to the load resistance unit 30 and controls the state of the load resistance unit 30 to be switched to the first state, the second state, and other states. The controller 80 may not always be provided in the magnetic memory 110. The controller 80 may be separated from the magnetic memory 110 and may be electrically connected to the magnetic memory 110.

The load resistance unit 30 includes the first resistance device R1, the second resistance device R2, a switching unit 20, a first terminal 21, and a second terminal 22. The first terminal 21 is set to a first electric potential Vdd1. The second terminal 22 is set to a second electric potential Vdd2. The absolute value of the second electric potential Vdd2 is less than the absolute value of the first electric potential Vdd1.

The magnetoresistive device 10 is provided between the load resistance unit 30 and a third terminal 23. However, the load resistance unit 30 may be provided between the magnetoresistive device 10 and the third terminal 23. The third terminal 23 is a ground electric potential. The first electric potential Vdd1 is a positive electric potential. The second electric potential Vdd2 is a positive electric potential that is lower than the first electric potential Vdd1. Thereby, current flows from the first terminal 21 toward the third terminal 23 or from the second terminal 22 toward the third terminal 23. However, if the electric potential of the third terminal 23 is sufficiently lower than the second electric potential Vdd2, the electric potential of the third terminal 23 may not be the ground electric potential.

Conversely, the third terminal 23 may be set to a positive electric potential; and the first electric potential Vdd1 and the second electric potential Vdd2 may be set to the ground electric potential or negative electric potentials. In such a case, current flows from the third terminal 23 toward the first terminal 21 or from the third terminal 23 toward the second terminal 22.

The first resistance device R1 is provided between the first terminal 21 and the magnetoresistive device 10. The second resistance device R2 is provided between the second terminal 22 and the magnetoresistive device 10. In other words, the first resistance device R1 or the second resistance device R2 is connected in series with the magnetoresistive device 10. The first resistance device R1 and the second resistance device R2 may be connected in parallel with the magnetoresistive device 10.

The first resistance device R1 has differential resistance RL1. The second resistance device R2 has differential resistance RL2. The differential resistance RL2 is lower than the differential resistance RL1. The switching unit 20 selectively connects the first resistance device R1 or the second resistance device R2 to the magnetoresistive device 10. The switching unit 20 connects the first resistance device R1 to the magnetoresistive device 10. Thereby, the load resistance unit is switched to the first state. The switching unit 20 connects the second resistance device R2 to the magnetoresistive device 10. Thereby, the load resistance unit 30 is switched to the second state.

The switching unit 20 includes a first switching device SW1 and a second switching device SW2. The first switching device SW1 includes a first major electrode tm1, a second major electrode tm2, and a first control electrode tc1. The second switching device SW2 includes a third major electrode tm3, a fourth major electrode tm4, and a second control electrode tc2.

MOSFETs are included in the first switching device SW1 and the second switching device SW2. In a transistor such as a MOSFET, a spin MOSFET, etc., current substantially does not flow between the source and drain when the voltage Vgs between the gate and source is lower than the threshold voltage Vth of the transistor. In the specification of the application, this state is defined as "OFF." The current flows between the source and drain when the voltage Vgs is higher than the threshold voltage Vth. In the specification of the application, this state is defined as "ON."

One terminal of the first resistance device R1 is electrically connected to the first terminal 21. The other terminal of the first resistance device R1 is electrically connected to the first major electrode tm1 of the first switching device SW1. The second major electrode tm2 of the first switching device SW1 is electrically connected to one terminal 10a of the magnetoresistive device 10. One terminal of the second resistance device R2 is electrically connected to the second terminal 22. The other terminal of the second resistance device R2 is electrically connected to the third major electrode tm3 of the second switching device SW2. The fourth major electrode tm4 of the second switching device SW2 is electrically connected to the one terminal 10a of the magnetoresistive device 10. The other terminal 10b of the magnetoresistive device 10 is electrically connected to the third terminal 23.

The first control electrode tc1 of the first switching device SW1 and the second control electrode tc2 of the second switching device SW2 are electrically connected to the controller 80.

The controller 80 performs the switching of ON/OFF of the first switching device SW1 and the second switching device SW2. The controller 80 switches the first switching device SW1 ON. Thereby, current path that has the first resistance device R1 as a load is formed; and current flows in the magnetoresistive device 10 based on the first electric potential Vdd1 and the first resistance device R1. The controller 80 switches the second switching device SW2 ON. Thereby, current path that has the second resistance device R2 as a load is formed; and current flows in the magnetoresistive device 10 based on the second electric potential Vdd2 and the second resistance device R2.

In the first state, the first resistance device R1 is electrically connected to the magnetoresistive device 10; and current in the magnetoresistive device 10. In the second state, the second resistance device R2 is electrically connected to the magnetoresistive device 10; and current in the magnetoresistive device 10. The differential resistance RL2 of the second resistance device R2 is lower than the differential resistance RL1 of the first resistance device R1.

Figure 2:
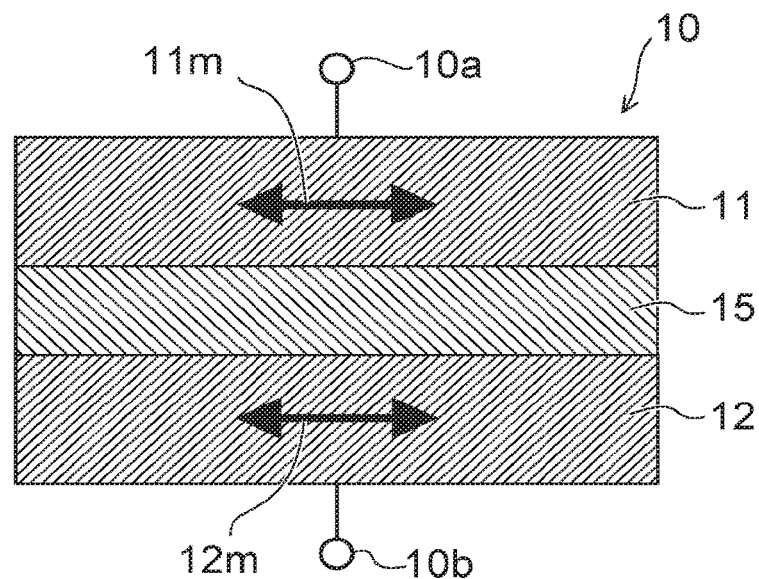
FIG. 2 is a cross-sectional view schematically showing the magnetoresistive device according to the first embodiment.

FIG. 2 is a cross-sectional view schematically showing the magnetoresistive device according to the first embodiment.

As shown in FIG. 2, the magnetoresistive device 10 includes a first ferromagnetic layer 11 and a second ferromagnetic layer 12. The second ferromagnetic layer 12 is provided to be separated from the first ferromagnetic layer 11. The magnetoresistive device 10 includes a nonmagnetic layer 15. The nonmagnetic layer 15 is provided between the first ferromagnetic layer 11 and the second ferromagnetic layer 12. In other words, in the magnetoresistive device 10, the first ferromagnetic layer 11, the nonmagnetic layer 15, and the second ferromagnetic layer 12 are stacked in this order.

The first ferromagnetic layer 11 is provided between the load resistance unit 30 and the third terminal 23. The second ferromagnetic layer 12 is provided between the third terminal 23 and the first ferromagnetic layer 11. In other words, the first ferromagnetic layer 11 is used as the one terminal 10a of the magnetoresistive device 10. The second ferromagnetic layer 12 is used as the other terminal 10b of the magnetoresistive device 10. The first ferromagnetic layer 11 is electrically connected to the second major electrode tm2 of the first switching device SW1 and the fourth major electrode tm4 of the second switching device SW2. The second ferromagnetic layer 12 is electrically connected to the third terminal 23.

In the first state and the second state, the directions of the current flowing between the first ferromagnetic layer 11 and the second ferromagnetic layer 12 inside the magnetoresistive device 10 are set to be the same. The direction of the current flowing between the first ferromagnetic layer 11 and the second ferromagnetic layer 12 inside the magnetoresistive device 10 at this time is defined as the first direction.

The orientation of a magnetization 11m of the first ferromagnetic layer 11 is changeable. In other words, the first ferromagnetic layer 11 is a free magnetic layer. The orientation of a magnetization 12m of the second ferromagnetic layer 12 is changeable. In other words, the second ferromagnetic layer 12 is a free magnetic layer.

The orientation of the magnetization 11m and the orientation of the magnetization 12m are set to be substantially parallel or substantially antiparallel to each other. The first ferromagnetic layer 11 and the second ferromagnetic layer 12 may be in-plane magnetization films. The first ferromagnetic layer 11 and the second ferromagnetic layer 12 may be perpendicular magnetization films. The orientation of the magnetization 11m may be tilted with respect to the film surface of the first ferromagnetic layer 11. The orientation of the magnetization 12m may be tilted with respect to the film surface of the second ferromagnetic layer 12.

The nonmagnetic layer 15 contacts the first ferromagnetic layer 11. The nonmagnetic layer 15 contacts the second ferromagnetic layer 12. The nonmagnetic layer 15 includes an insulator. The nonmagnetic layer 15 is a tunneling barrier layer. The thickness of the nonmagnetic layer 15 is 2 nm or less. Thereby, tunneling current flows in the nonmagnetic layer 15 when voltage is applied.

Thus, in the case where the nonmagnetic layer 15 is a tunneling barrier layer based on an insulator, the first ferromagnetic layer 11, the second ferromagnetic layer 12, and the nonmagnetic layer 15 have a magnetic tunnel junction (MTJ) structure.

In the magnetoresistive device 10, spin-polarized electrons act on the first ferromagnetic layer 11 or the second ferromagnetic layer 12 by current. Thus, in the magnetoresistive device 10, the orientation of the magnetization 11m of the first ferromagnetic layer 11 or the orientation of the magnetization 12m of the second ferromagnetic layer 12 is changed by current flowing in the magnetoresistive device 10.

The magnetoresistive device 10 has a first resistance state and a second resistance state. The resistance value of the magnetoresistive device 10 in the second resistance state is higher than the resistance value of the magnetoresistive device 10 in the first resistance state. The state is switched to the second resistance state when the orientation of the magnetization 11m of the first ferromagnetic layer 11 is substantially antiparallel to the orientation of the magnetization 12m of the second ferromagnetic layer 12. The state is switched to the first resistance state when the orientation of the magnetization 11m of the first ferromagnetic layer 11 is substantially parallel to the orientation of the magnetization 12m of the second ferromagnetic layer 12. The state may be switched to the second resistance state when the orientation of the magnetization 11m of the first ferromagnetic layer 11 is substantially parallel to the orientation of the magnetization 12m of the second ferromagnetic layer 12; and the state may be switched to the first resistance state when the orientation of the magnetization 11m of the first ferromagnetic layer 11 is substantially antiparallel to the orientation of the magnetization 12m of the second ferromagnetic layer 12.

Here, the orientation of the magnetization 11m being substantially parallel to the orientation of the magnetization 12m is when the orientation of the magnetization 11m is near the orientation of the magnetization 12m. The orientation of the magnetization 11m being substantially antiparallel to the orientation of the magnetization 12m is when the orientation of the magnetization 11m is near the reverse orientation of the magnetization 12m.

Thus, in the magnetoresistive device 10, the magnetization 11m and the magnetization 12m are set to be substantially parallel or substantially antiparallel; and the change between the resistance value when substantially parallel and the resistance value when substantially antiparallel is utilized to store data.

The second resistance state is "0;" and the first resistance state is "1." The second resistance state may be used as "1;" and the first resistance state may be used as "0." The first resistance state and the second resistance state are not limited to "0" or "1" and may be other states.

The setting of the first resistance state or the second resistance state is implemented by the controller 80. Hereinbelow, the change of the state between the first resistance state and the second resistance state is called "writing."

The writing operation of the magnetoresistive device 10 is described below.

Figure 3A:
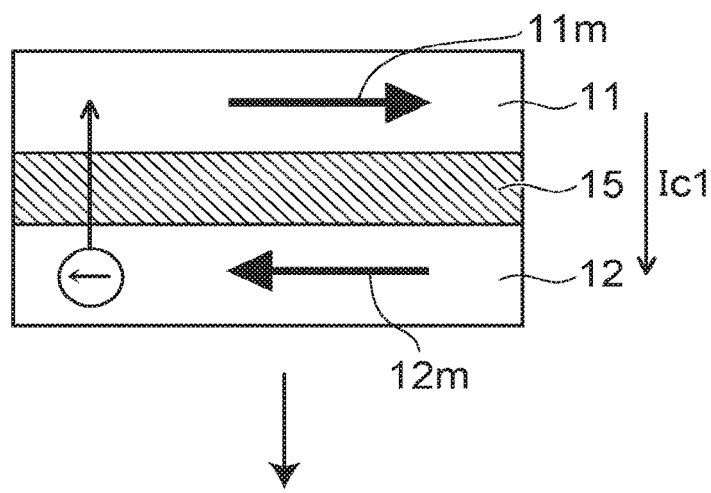
FIGS. 3A and 3B are cross-sectional views schematically showing the writing operation of the magnetoresistive device.
Figure 3B:
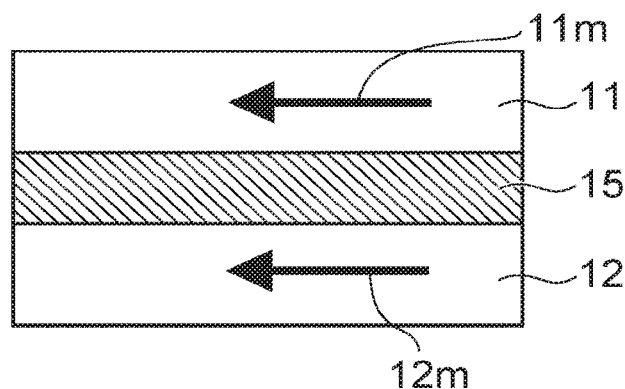

FIG. 3A and FIG. 3B are cross-sectional views schematically showing the writing operation of the magnetoresistive device 10.

As shown in FIG. 3A, first, the magnetization 11m and the magnetization 12m will be described from the substantially antiparallel state. In FIG. 3A, the magnetoresistive device 10 is in the second resistance state. For convenience herein, the state in which the magnetization 11m and the magnetization 12m face the right direction with respect to the page surface is called the "rightward orientation;" and the state of facing the left direction is called the "leftward orientation." In other words, FIG. 3A shows the substantially antiparallel state in which the magnetization 11m has the rightward orientation and the magnetization 12m has the leftward orientation. In the substantially antiparallel state, the magnetization 11m may have the leftward orientation; and the magnetization 12m may have the rightward orientation. In the substantially parallel state, both the magnetization 11m and the magnetization 12m may have the rightward orientation; or both the magnetization 11m and the magnetization 12m may have the leftward orientation. In other words, in the magnetoresistive device 10, the second resistance state and the first resistance state each have two types of combinations of the orientations of the magnetizations.

When the magnetoresistive device 10 is switched from substantially antiparallel to substantially parallel, the first switching device SW1 is switched ON from the state in which the first switching device SW1 and the second switching device SW2 are OFF. Thereby, the load resistance unit 30 is switched to the first state; and the current that has the first direction between the first ferromagnetic layer 11 and the second ferromagnetic layer 12. Electrons flow in the opposite direction of the current.

When the electrons flow from the second ferromagnetic layer 12 toward the first ferromagnetic layer 11, the majority spin of the second ferromagnetic layer 12 is injected into the first ferromagnetic layer 11 as shown in FIG. 3A. The critical current at which the orientation of the magnetization 11m of the first ferromagnetic layer 11 reverses due to the spin injection is defined as first critical current Ic1. When spin injection current that is not less than the first critical current Ic1, magnetization reversal of the first ferromagnetic layer 11 occurs and the orientations of the magnetizations 11m and 12m become substantially parallel to each other as shown in FIG. 3B. At this time, the resistance of the magnetoresistive device 10 changes from the second resistance state to the first resistance state.

In the description of the case where the magnetoresistive device 10 changes from the second resistance state to the first resistance state, the case that the electrons flow from the second ferromagnetic layer 12 toward the first ferromagnetic layer 11 as shown in FIG. 3A is indicated. Since both the first ferromagnetic layer 11 and the second ferromagnetic layer 12 are free magnetic layers, the electrons may flow from the first ferromagnetic layer 11 toward the second ferromagnetic layer 12 which is the reverse of the flow of the electrons of FIG. 3A.

Figure 4:
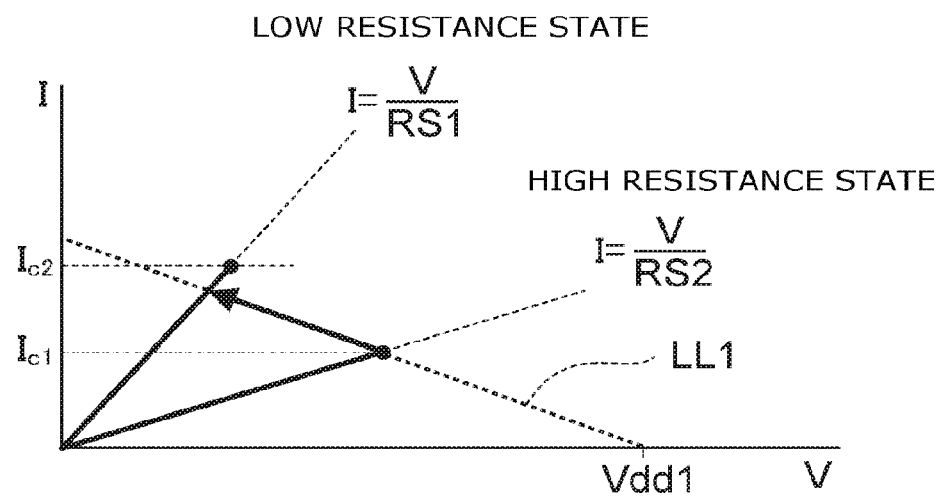
FIG. 4 is a graph showing an example of the current-voltage characteristics of the magnetoresistive device.

FIG. 4 is a graph showing an example of the current-voltage characteristics of the magnetoresistive device.

FIG. 4 shows a first load line LL1 and the current-voltage characteristics of the magnetoresistive device 10 when the magnetoresistive device 10 changes from the second resistance state to the first resistance state. The current and the voltage that are applied to the magnetoresistive device 10 stabilize at the current and the voltage of the intersection between the load line and the current-voltage characteristics of the magnetoresistive device 10.

When the magnetoresistive device 10 changes from the second resistance state to the first resistance state, the voltage that is applied to the magnetoresistive device 10 decreases. At this time, the current I that flows in the magnetoresistive device 10 and the voltage V that is applied to the magnetoresistive device 10 change along the first load line LL1 of the current-voltage characteristics.

The method for writing the magnetization 11m and the magnetization 12m from substantially parallel to substantially antiparallel is described below.

When the magnetoresistive device 10 is switched from substantially parallel to substantially antiparallel, the second switching device SW2 is switched ON from the state in which the first switching device SW1 and the second switching device SW2 are OFF. Thereby, the load resistance unit 30 is switched to the second state; and the current having the first direction between the first ferromagnetic layer 11 and the second ferromagnetic layer 12. The direction of the current is the same as the direction of the current flowing in the first state.

Figure 5A:
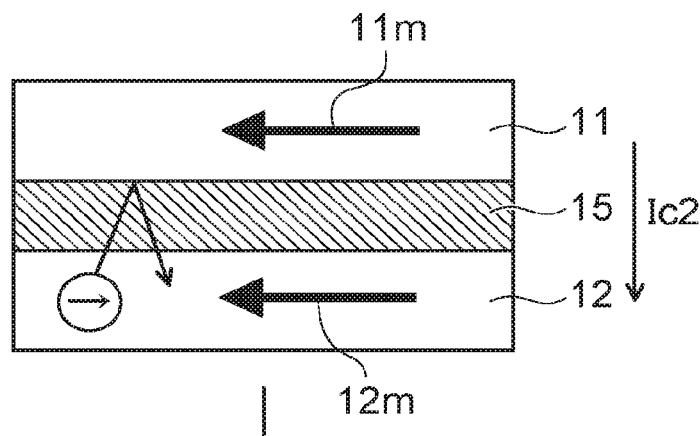
FIGS. 5A and 5B are cross-sectional views schematically showing the writing operation of the magnetoresistive device.
Figure 5B:
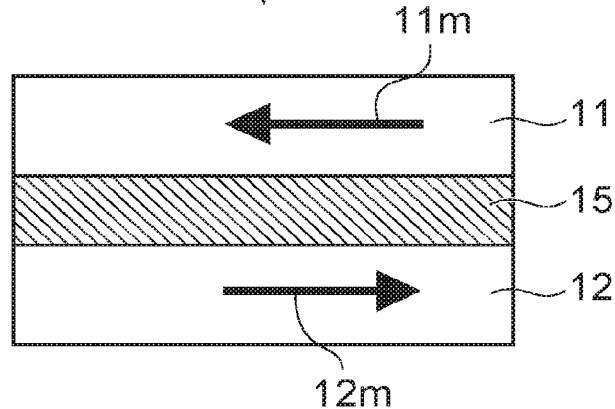

FIG. 5A and FIG. 5B are cross-sectional views schematically showing the writing operation of the magnetoresistive device 10.

As shown in FIG. 5A, the electrons flow from the second ferromagnetic layer 12 toward the first ferromagnetic layer 11. The majority spin of the second ferromagnetic layer 12 flows into the first ferromagnetic layer 11. However, the minority spin of the second ferromagnetic layer 12 is substantially antiparallel to the magnetization 11m of the first ferromagnetic layer 11 and therefore substantially cannot flow into the first ferromagnetic layer 11. Therefore, the minority spin of the second ferromagnetic layer 12 accumulates in the second ferromagnetic layer 12.

That is, as shown in FIG. 5A, the minority spin of the second ferromagnetic layer 12 is reflected by the first ferromagnetic layer 11 and injected into the second ferromagnetic layer 12. The critical current at which the magnetization 12m of the second ferromagnetic layer 12 reverses due to the spin injection is defined as second critical current Ic2. When spin injection current that is not less than the second critical current Ic2, magnetization reversal of the second ferromagnetic layer 12 occurs; and the orientations of the magnetizations 11m and 12m become substantially antiparallel to each other as shown in FIG. 5B. At this time, the resistance of the magnetoresistive device 10 changes from the first resistance state to the second resistance state.

In the description of the case where the magnetoresistive device 10 changes from the first resistance state to the second resistance state, the case that the electrons flow from the second ferromagnetic layer 12 toward the first ferromagnetic layer 11 as shown in FIG. 5A is indicated. Since both the first ferromagnetic layer 11 and the second ferromagnetic layer 12 are free magnetic layers, the electrons may flow in the direction from the first ferromagnetic layer 11 toward the second ferromagnetic layer 12, which is the reverse of the flow of the electrons of FIG. 5A.

Figure 6:
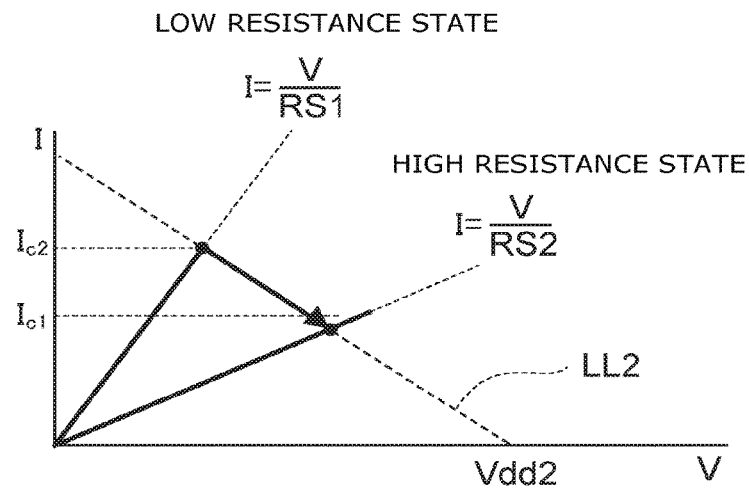
FIG. 6 is a graph showing an example of the current-voltage characteristics of the magnetoresistive device.

FIG. 6 is a graph showing an example of the current-voltage characteristics of the magnetoresistive device.

FIG. 6 shows the current-voltage characteristics and a second load line LL2 when the magnetoresistive device changes from the first resistance state to the second resistance state.

When the magnetoresistive device 10 changes from the first resistance state to the second resistance state, the voltage that is applied to the magnetoresistive device 10 increases. At this time, the current I that flows in the magnetoresistive device 10 and the voltage V that is applied to the magnetoresistive device 10 change along the second load line LL2 of the current-voltage characteristics because the second electric potential Vdd2 and the second resistance device R2 are connected in series with the magnetoresistive device 10.

When reading the data of the magnetoresistive device 10, the current that is smaller than the first critical current Ic1 flows; and the electrical resistance of the magnetoresistive device 10 is sensed. Thereby, it can be sensed whether the magnetoresistive device 10 is in the first resistance state or in the second resistance state. The direction of the current flowing in the magnetoresistive device 10 in the reading may be the same as in the writing or may be the reverse of the writing.

After the magnetoresistive device 10 changes from the first resistance state to the second resistance state, the current that flows in the magnetoresistive device 10 must be Ic1 or less. To this end, the differential resistance RL2 of the second resistance device R2 is set to be sufficiently low.

Figure 7:
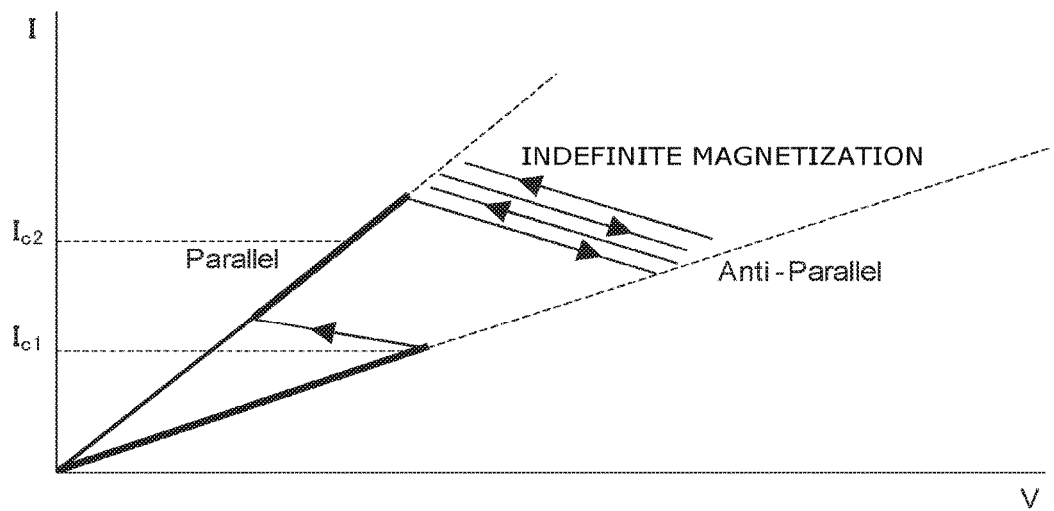
FIG. 7 is a graph showing an example of the current-voltage characteristics of the magnetoresistive device.

FIG. 7 is a graph showing an example of the current-voltage characteristics of the magnetoresistive device.

As shown in FIG. 7, if the current that flows in the magnetoresistive device 10 is Ic1 or more after the change from the first resistance state to the second resistance state, the change between the first resistance state and the second resistance state continues. At this time, the orientations of the magnetizations 11m and 12m repeat being substantially parallel and substantially antiparallel to each other. Therefore, the orientations of the magnetizations 11m and 12m undesirably become indefinite.

To prevent the magnetizations 11m and 12m from becoming indefinite as recited above, the differential resistance RL1 of the first resistance device R1 is set to satisfy Formula (1) recited below. Also, the differential resistance RL2 of the second resistance device R2 is set to satisfy Formula (2) recited below.

$$RL1 > (Ic1 \times RS2 - Ic2 \times RS1)/(Ic2 - Ic1) \quad (1)$$

$$RL2 < (Ic1 \times RS2 - Ic2 \times RS1)/(Ic2 - Ic1) \quad (2)$$

In Formula (1) and Formula (2), RS1 is the resistance value of the magnetoresistive device 10 when the current caused to flow in the magnetoresistive device 10 in the first resistance state is near the second critical current Ic2. RS2 is the resistance value of the magnetoresistive device 10 when the current caused to flow in the magnetoresistive device 10 in the second resistance state is near the first critical current Ic1. In other words, RS1 is the resistance value of the magnetoresistive device 10 when the current slightly smaller than the second critical current Ic2 flows in the magnetoresistive device 10 in the first resistance state. In other words, RS2 is the resistance value of the magnetoresistive device 10 when the current slightly smaller than the first critical current Ic1 flows in the magnetoresistive device 10 in the second resistance state.

Thus, the differential resistance RL2 of the second resistance device R2 is set to be lower than the differential resistance RL1 of the first resistance device R1. More specifically, the first resistance device R1 of the differential resistance RL1 that satisfies Formula (1) is used; and the second resistance device R2 of the differential resistance RL2 that satisfies Formula (2) is used. Thereby, the current that flows in the magnetoresistive device 10 in the first resistance state is smaller than the second critical current Ic2 after the magnetoresistive device 10 change from the second resistance state to the first resistance state by the current flowing in the first direction at the magnetoresistive device 10. The current that flows in the magnetoresistive device 10 in the second resistance state is smaller than the first critical current Ic1 after the magnetoresistive device 10 change from the first resistance state to the second resistance state by the current flowing in the first direction. Thereby, the indefinite orientations of the magnetizations 11m and 12m can be suppressed. Misoperations of the magnetic memory 110 can be suppressed.

Thus, in the magnetic memory 110 according to the embodiment, the magnetoresistive device 10 is used in which the free magnetic layers are provided on two sides of the nonmagnetic layer 15; the first resistance device R1 that has the high differential resistance RL1 is used in the change from the second resistance state to the first resistance state; and the second resistance device R2 that has the low differential resistance RL2 is used in the change from the first resistance state to the second resistance state. Thereby, the writing to the magnetoresistive device 10 can be performed using current in only one direction.

There is a magnetoresistive device in which one ferromagnet is a fixed magnetic layer in which the orientation of the magnetization is fixed and the other ferromagnet is a free magnetic layer in which the orientation of the magnetization can be modified. The magnetization reversal is performed by applying a magnetic field from the outside or by spin injection current flowing in the device. Downscaling of the device is necessary due to the technical progress of recent years; and the spin injection magnetization reversal technology that has scalability is being used for the magnetization reversal. In the spin injection magnetization reversal, the orientation of the magnetization is dependent on the current. Therefore, the direction of the spin injection current switching to substantially parallel is opposite to the direction of the spin injection current switching to substantially antiparallel. Therefore, when writing the magnetoresistive device, a peripheral circuit is necessary for bidirectional current to flow in the device.

Integrated circuits that are generally used include MOSFET devices. In the circuit that uses MOSFETs, a p-channel MOSFET is used on the side of the power supply having the positive voltage; and an n-channel MOSFET is used on the side of the power supply having the reference voltage. The reference voltage is for example ground voltage. Therefore, a circuit that provides bidirectional current has twice the circuit scale compared to a circuit providing current to flow in only one direction. The circuit that provides bidirectional current has a large peripheral circuit and impedes integration.

The resistance value of the MOSFET device undesirably becomes large in the case where there is a parasitic resistance between the source terminal and the power supply. Therefore, it is desirable to reduce the parasitic resistance to provide large current. In a memory using a MTJ, a MOSFET is used as the selection transistor; but it is desirable for there to be no MTJ between the power supply and the source terminal of the MOSFET to provide large current. However, in the case where bidirectional current is provided, the large current is impeded from flowing because a MTJ always must be inserted between the power supply and the source terminal of the MOSFET in either direction of the current.

An n-channel MOSFET, a p-channel MOSFET, or both are used as spin MOSFETs in a memory that uses a spin MOSFET. In the case of a CMOS configuration, the normal connection is in the order of VDD-p-channel MOSFET-n-channel MOSFET-GND; and the direction of the current is in one direction. An extra switching device is necessary to cause current having the reverse direction to flow in the CMOS configuration; and higher integration is impeded.

Thus, providing bidirectional current is a large issue from the perspectives of higher integration of the circuit and providing large current.

Conversely, in the magnetic memory 110 according to the embodiment, the circuit scale of the peripheral circuit is small because the writing is performed using unidirectional current. Higher integration of the magnetic memory 110 is possible.

Because the direction in which the current flows in the magnetic memory 110 is in one direction, it is unnecessary to insert the magnetoresistive device 10 between the power supply and the source terminal of the selection transistor. Therefore, the resistance between the power supply and the source terminal of the selection transistor can be low. Thereby, it is possible to provide large current in the writing operation.

Thus, because the writing is performed using unidirectional current in the magnetic memory 110 according to the embodiment, higher integration of the circuit is possible; and large current can flow in the magnetoresistive device 10.

The first ferromagnetic layer 11 and the second ferromagnetic layer 12 may include CoFeB. The nonmagnetic layer 15 may include, for example, MgO. The first switching device SW1 and the second switching device SW2 may include n-channel MOSFETs having sufficiently low resistances when ON. The material of the first resistance device R1 may include Si doped with a high concentration of impurities. The material of the second resistance device R2 may include Mo.

Figure 8A:
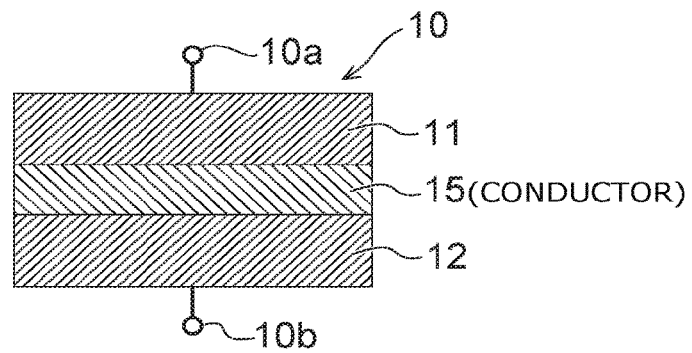
FIGS. 8A to 8C are cross-sectional views schematically showing the magnetoresistive device according to the first embodiment.
Figure 8B:
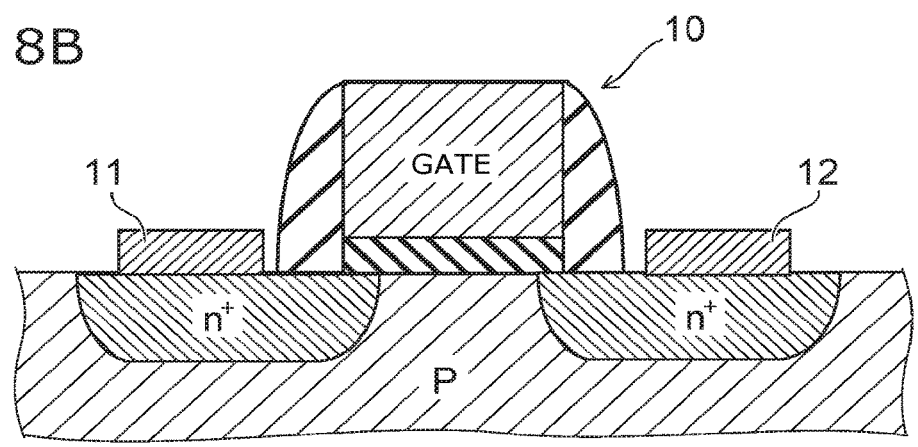
Figure 8C:
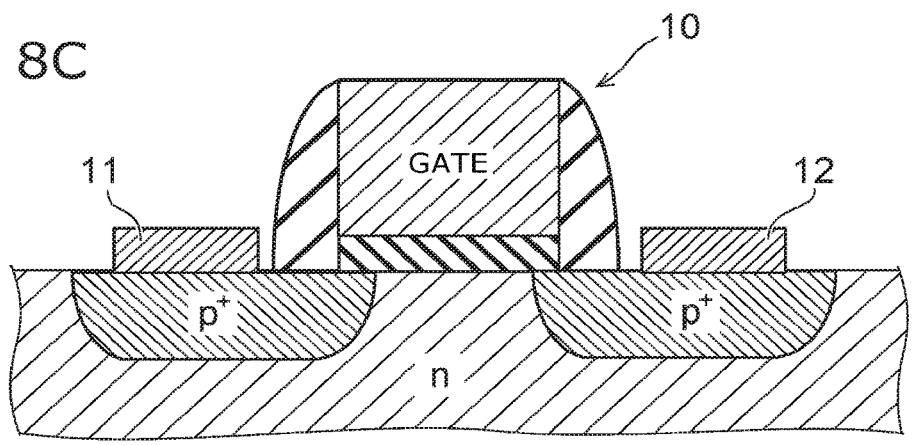

FIG. 8A to FIG. 8C are cross-sectional views schematically showing the magnetoresistive device according to the first embodiment.

The nonmagnetic layer 15 is a tunneling barrier layer including an insulator. In other words, the magnetoresistive device 10 is a MTJ device. This is not limited thereto; and the nonmagnetic layer 15 may include, for example, a conductor. In other words, the magnetoresistive device 10 may be a GMR device as shown in FIG. 8A. As shown in FIG. 8B, the magnetoresistive device 10 may be an n-channel spin MOSFET. As shown in FIG. 8C, the magnetoresistive device 10 may be a p-channel MOSFET.

FIG. 9A to FIG. 9E and FIG. 10A to FIG. 10F are circuit diagrams schematically showing magnetic memories according to the first embodiment.

In the load resistance unit 30 of a magnetic memory 111 as shown in FIG. 9A and FIG. 9B, the first resistance device R1, the second resistance device R2, the first switching device SW1, and the second switching device SW2 each are connected in parallel with the magnetoresistive device 10. Thus, the first resistance device R1 and the second resistance device R2 which are load resistances may be connected in parallel with the magnetoresistive device 10.

A third switching device SW3 and a fourth switching device SW4 are provided in the load resistance unit 30 of the magnetic memory 111. The third switching device SW3 is provided between the first terminal 21 and the magnetoresistive device 10. The fourth switching device SW4 is provided between the second terminal 22 and the magnetoresistive device 10. The ON/OFF of the third switching device SW3 and the fourth switching device SW4 is controlled by the controller 80.

As shown in FIG. 9A, the first switching device SW1 and the third switching device SW3 are switched ON from the state in which the first to fourth switching devices SW1 to SW4 are switched OFF. Thereby, the load resistance unit 30 is switched to the first state. Then, as shown in FIG. 9B, the second switching device SW2 and the fourth switching device SW4 are switched ON from the state in which the first to fourth switching devices SW1 to SW4 are switched OFF. Thereby, the load resistance unit 30 is switched to the second state.

The controller 80 switches the first switching device SW1 and the third switching device SW3 ON when the magnetoresistive device 10 changes from the second resistance state to the first resistance state. In other words, the controller 80 switches the load resistance unit 30 to the first state and applies the first electric potential Vdd1 to the magnetoresistive device 10 when the magnetoresistive device 10 changes from the second resistance state to the first resistance state.

Then, the controller 80 switches the second switching device SW2 and the fourth switching device SW4 ON after switching all of the switching devices SW1 to SW4 OFF when the magnetoresistive device 10 changes from the first resistance state to the second resistance state. In other words, the controller 80 switches the load resistance unit 30 to the second state and applies the second electric potential Vdd2 to the magnetoresistive device 10 when the magnetoresistive device 10 changes from the first resistance state to the second resistance state.

In the load resistance unit 30 of a magnetic memory 112 as shown in FIG. 9C to FIG. 9E, the first resistance device R1 and the first switching device SW1 are connected in series with the magnetoresistive device 10; and the second resistance device R2 and the second switching device SW2 are connected in parallel with the magnetoresistive device 10. In the magnetic memory 112, the fourth switching device SW4 is provided between the second terminal 22 and the magnetoresistive device 10.

In the magnetic memory 112 as shown in FIG. 9D, the first switching device SW1 is switched ON from the state in which the switching devices SW1, SW2, and SW4 are switched OFF. Thereby, the load resistance unit 30 is switched to the first state. Then, as shown in FIG. 9E, the second switching device SW2 and the fourth switching device SW4 are switched ON from the state in which the switching devices SW1, SW2, and SW4 are switched OFF. Thereby, the load resistance unit 30 is switched to the second state.

Figure 10A:
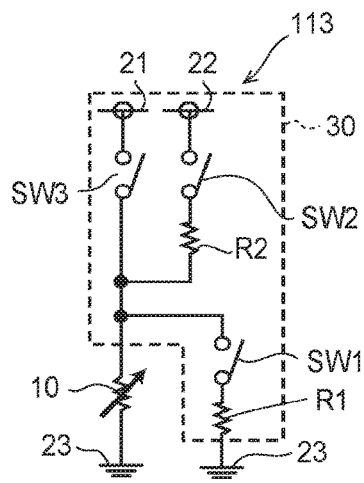
FIGS. 10A to 10F are circuit diagrams schematically showing magnetic memories according to the first embodiment.
Figure 10B:
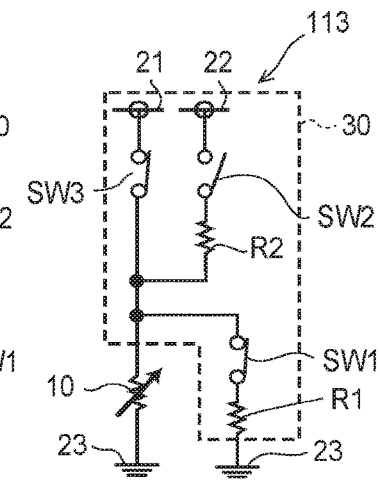
Figure 10C:
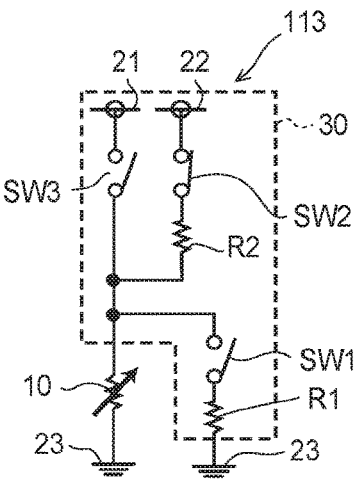

In the load resistance unit 30 of a magnetic memory 113 as shown in FIG. 10A to FIG. 10C, the first resistance device R1 and the first switching device SW1 are connected in parallel with the magnetoresistive device 10; and the second resistance device R2 and the second switching device SW2 are connected in series with the magnetoresistive device 10. In the magnetic memory 113, the third switching device SW3 is provided between the first terminal 21 and the magnetoresistive device 10.

In the magnetic memory 113 as shown in FIG. 10B, the first switching device SW1 and the third switching device SW3 are switched ON from the state in which the switching devices SW1 to SW3 are switched OFF. Thereby, the load resistance unit 30 is switched to the first state. Then, as shown in FIG. 10C, the second switching device SW2 is switched ON from the state in which the switching devices SW1 to SW3 are switched OFF. Thereby, the load resistance unit 30 is switched to the second state.

Figure 10D:
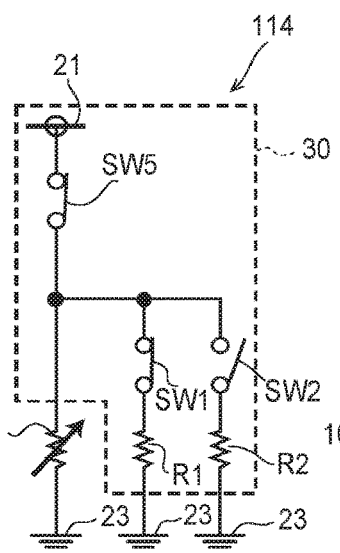
Figure 10E:
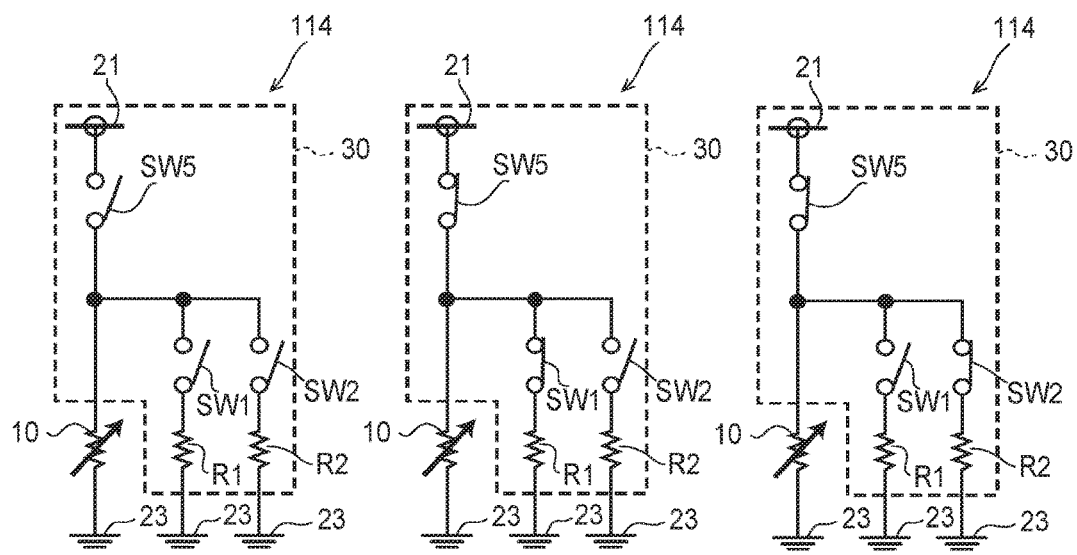
Figure 10F:
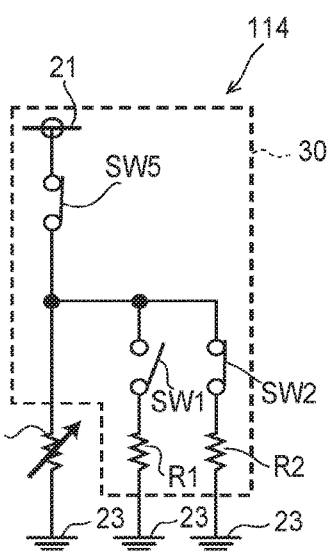

In the load resistance unit 30 of a magnetic memory 114 as shown in FIG. 10D to FIG. 10F, the first resistance device R1, the second resistance device R2, the first switching device SW1, and the second switching device SW2 each are connected in parallel with the magnetoresistive device 10. A fifth switching device SW5 is provided in the load resistance unit 30 of the magnetic memory 114. The fifth switching device SW5 is provided between the first terminal 21 and the magnetoresistive device 10. In the magnetic memory 114, only the first electric potential Vdd1 is applied to the magnetoresistive device 10. The ON/OFF of the fifth switching device SW5 is controlled by the controller 80.

In the magnetic memory 114 as shown in FIG. 10E, the first switching device SW1 and the fifth switching device SW5 are switched ON from the state in which the switching devices SW1, SW2, and SW5 are switched OFF. Thereby, the load resistance unit 30 is switched to the first state. Then, as shown in FIG. 10F, the second switching device SW2 and the fifth switching device SW5 are switched ON from the state in which the switching devices SW1, SW2, and SW5 are switched OFF. Thereby, the load resistance unit 30 is switched to the second state.

Thus, one of the first resistance device R1 or the second resistance device R2 which are load resistances may be connected in series with the magnetoresistive device 10; and the other may be connected in parallel with the magnetoresistive device 10.

In the case where the magnetoresistive device 10 of the embodiment is provided inside a CMOS circuit, the direction of the current can be in only one direction when performing the logic operations and when performing the writing of the memory. Thereby, extra switching devices are unnecessary; and even higher integration is possible. A highly-integrated reconfigurable logic circuit can be realized.

Second Embodiment

FIG. 11A, FIG. 11B, FIG. 12A, and FIG. 12B are circuit diagrams schematically showing magnetic memories according to a second embodiment.

Figure 11A:
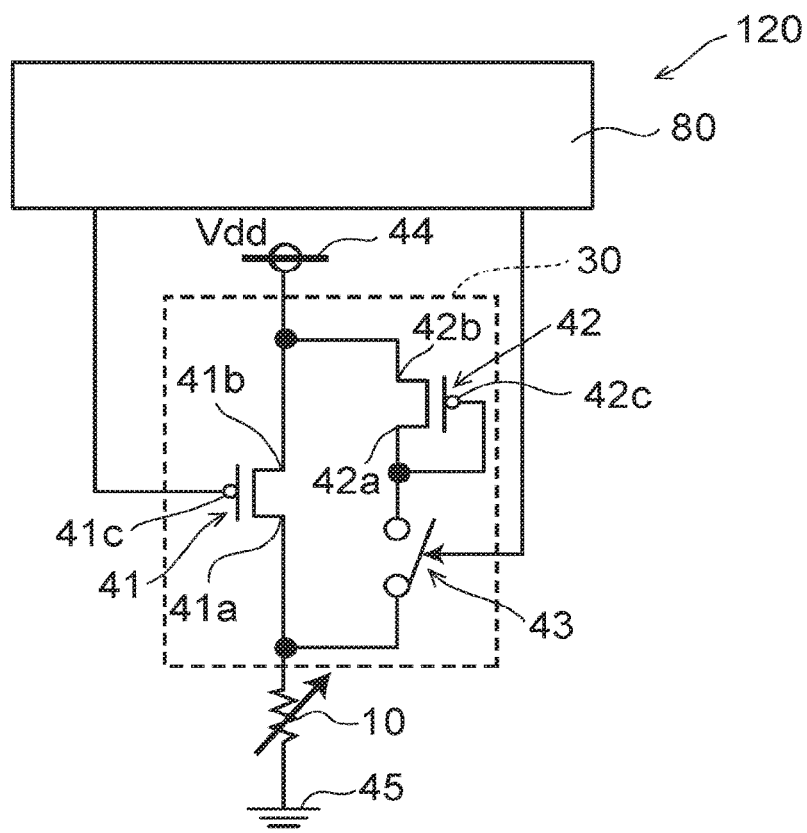
FIGS. 11A and 11B are circuit diagrams schematically showing magnetic memories according to a second embodiment.
Figure 11B:
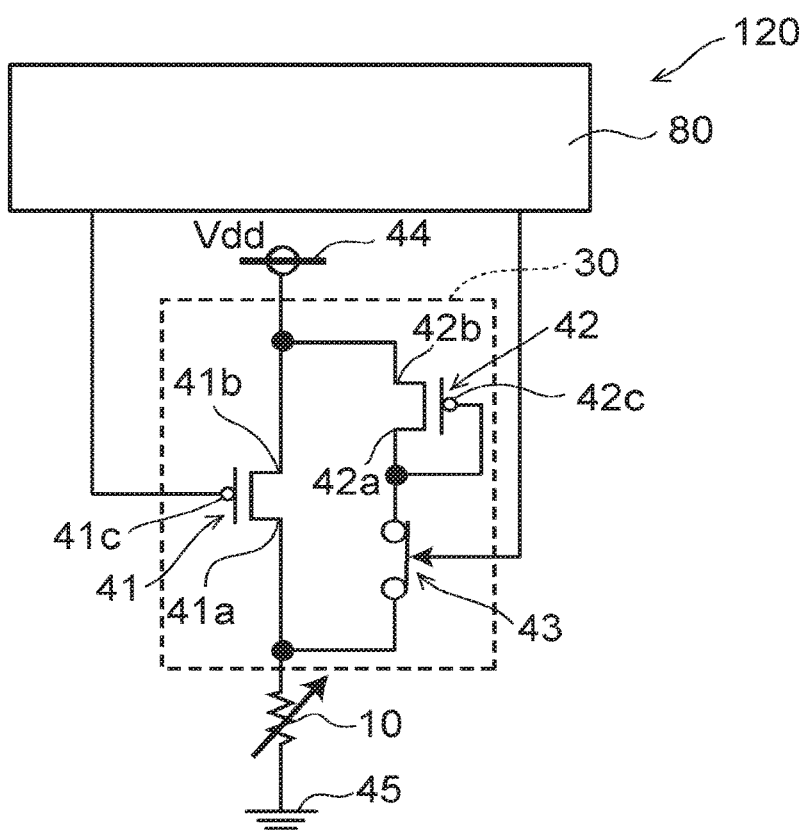
Figure 12A:
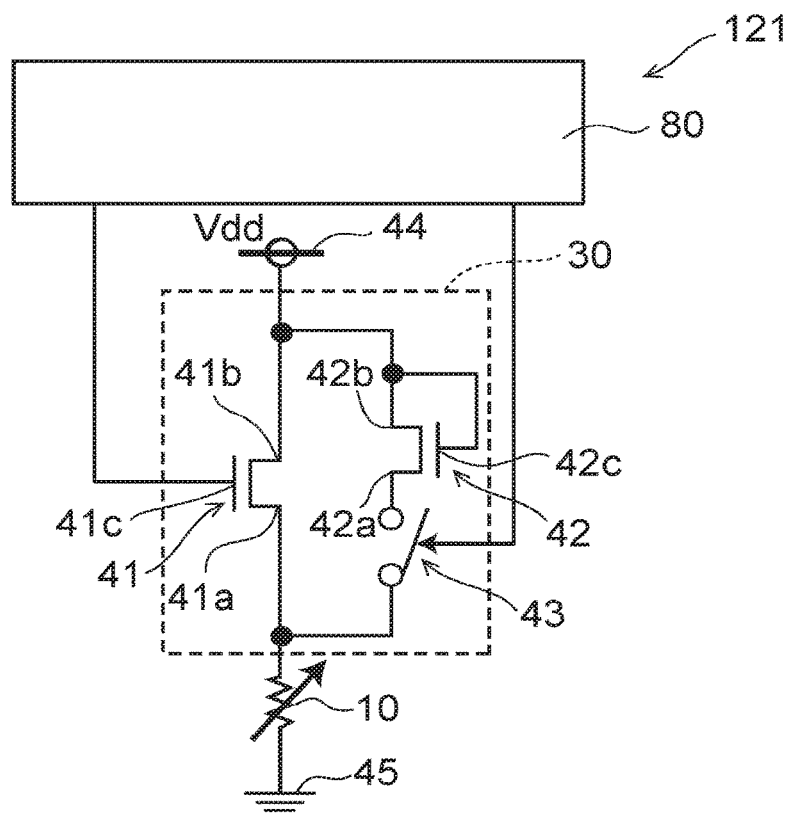
FIGS. 12A and 12B are circuit diagrams schematically showing magnetic memories according to a second embodiment.
Figure 12B:
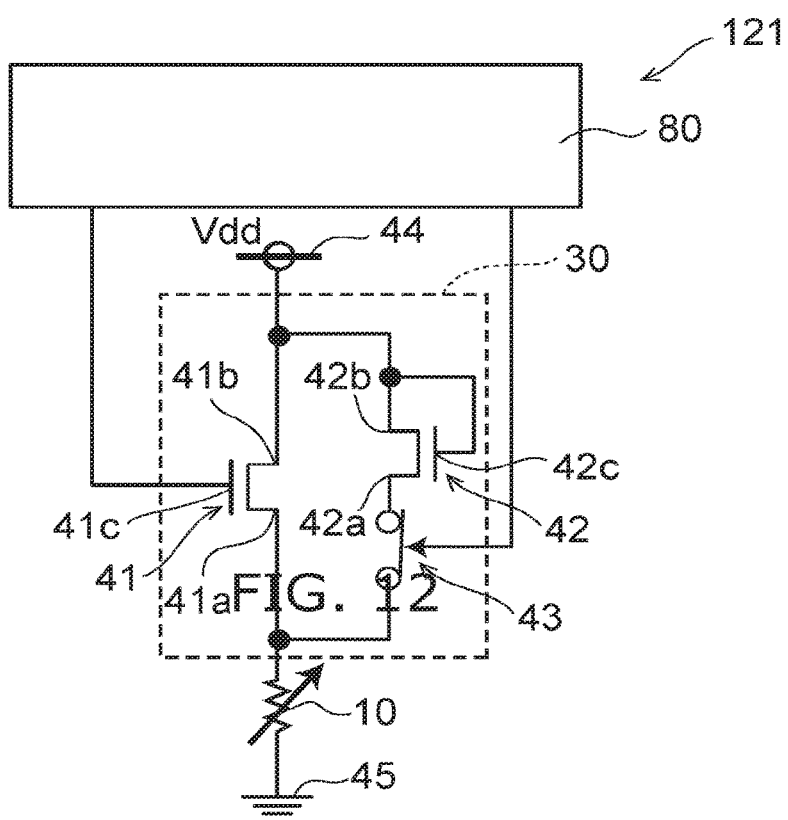

In a magnetic memory 120 as shown in FIG. 11A and FIG. 11B, the load resistance unit 30 includes a first semiconductor device 41 and a second semiconductor device 42. The first semiconductor device 41 and the second semiconductor device 42 include p-channel MOSFETs. The first semiconductor device 41 has high differential resistance and is the load resistance when the magnetoresistive device 10 changes from the second resistance state to the first resistance state. The second semiconductor device 42 has low differential resistance and is the load resistance when the magnetoresistive device 10 changes from the first resistance state to the second resistance state. In FIG. 11A and FIG. 11B, the first semiconductor device 41 and the second semiconductor device 42 include p-channel MOSFETs. In a magnetic memory 121 as shown in FIG. 12A and FIG. 12B, the first semiconductor device 41 and the second semiconductor device 42 may include n-channel MOSFETs. Hereinbelow, the first semiconductor device 41 and the second semiconductor device 42 are described as p-channel MOSFETs.

The load resistance unit 30 includes a switching device 43. The magnetic memory 120 includes a pair of power supply terminals 44 and 45. The power supply terminal 44 is set to a positive electric potential Vdd. The power supply terminal 45 is set to the ground electric potential. Thereby, the current having the first direction can flow in the magnetoresistive device 10. The power supply terminal 44 may be set to the ground electric potential or a negative electric potential; and the power supply terminal 45 may be set to the positive electric potential Vdd.

The first semiconductor device 41 includes a first electrode 41a, a second electrode 41b, and a first control electrode 41c. The first electrode 41a is electrically connected to the magnetoresistive device 10. The second electrode 41b is electrically connected to the power supply terminal 44. The first control electrode 41c is electrically connected to the controller 80. For the connection as shown in FIG. 11A, the current having the first direction flows in the magnetoresistive device 10 when the first semiconductor device 41 is switched ON. In other words, the first semiconductor device 41 connects the current path between the first electrode 41a and the second electrode 41b in series between the power supply terminal 44 and the magnetoresistive device 10.

The second semiconductor device 42 includes a third electrode 42a, a fourth electrode 42b, and a second control electrode 42c. The third electrode 42a is electrically connected to the switching device 43. The third electrode 42a is electrically connected to the magnetoresistive device 10 via the switching device 43. The fourth electrode 42b is electrically connected to the power supply terminal 44. The second control electrode 42c is electrically connected to the third electrode 42a.

For example, in the case where the second semiconductor device 42 is a p-channel MOSFET, the third electrode 42a is the drain electrode. The fourth electrode 42b is the source electrode. The second control electrode 42c is the gate electrode. In other words, the second semiconductor device 42 has a so-called diode connection. The second control electrode 42c is electrically connected to the drain electrode. Accordingly, for example, in the case where the second semiconductor device 42 is an n-channel MOSFET, the second control electrode 42c is electrically connected to the fourth electrode 42b. Thereby, the second semiconductor device 42 causes the current to flow in the first direction. In other words, for example, the second semiconductor device 42 connects the current path between the third electrode 42a and the fourth electrode 42b in parallel with the current path of the first semiconductor device 41.

The switching device 43 is electrically connected between the second semiconductor device 42 and the magnetoresistive device 10. The ON/OFF of the switching device 43 is controlled by the controller 80. As shown in FIG. 11B, when the switching device 43 is switched ON, the second semiconductor device 42 and the magnetoresistive device 10 are electrically connected; and the current having the first direction flows in the magnetoresistive device 10. The switching device 43 may be electrically connected between the second semiconductor device 42 and the power supply terminal 44. The switching device 43 includes a MOSFET, a bipolar transistor, etc.

Figure 13A:
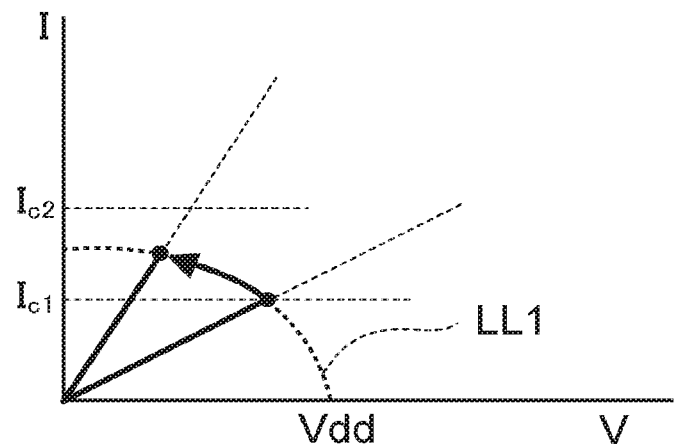
FIGS. 13A and 13B are graphs showing an example of the current-voltage characteristics of the magnetoresistive device.
Figure 13B:
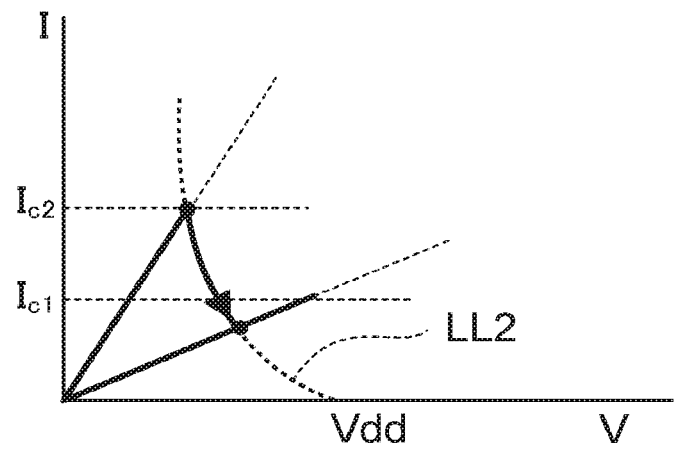

FIG. 13A and FIG. 13B are graphs showing examples of the current-voltage characteristics of the magnetoresistive device.

FIG. 13A shows the first load line LL1 and the current-voltage characteristics when the magnetoresistive device 10 change from the second resistance state to the first resistance state.

In the magnetic memory 120, the first semiconductor device 41 is switched ON by applying low voltage to the first control electrode 41c of the first semiconductor device 41. Thereby, the load resistance unit 30 is switched to the first state; and similarly to the first embodiment recited above, the magnetoresistive device 10 changes from the second resistance state to the first resistance state. In the magnetic memory 120, the load resistance unit 30 is switched to the first state when the current flows between the first electrode 41a and the second electrode 41b.

As shown in FIG. 13A, when the magnetoresistive device changes from the second resistance state to the first resistance state, the current I that flows in the magnetoresistive device 10 and the voltage V that is applied to the magnetoresistive device 10 change along the first load line LL1 of the current-voltage characteristics. When the magnetoresistive device 10 changes from the second resistance state to the first resistance state, the first semiconductor device 41 has nonlinear current-voltage characteristics in which the differential resistance RL increases.

The current flowing in the magnetoresistive device 10 must be less than Ic2 after the magnetoresistive device 10 changes from the second resistance state to the first resistance state. Therefore, it is necessary for the load resistance in the change from the second resistance state to the first resistance state to have high differential resistance RL. However, in the case where linear resistance is used, the power supply electric potential Vdd becomes high; and the power consumption undesirably becomes large.

Conversely, in the magnetic memory 120 according to the embodiment, the nonlinear first semiconductor device 41 having the high differential resistance RL is used when the magnetoresistive device 10 changes from the second resistance state to the first resistance state. Thereby, low power-consumption operation is realized because low electric potential Vdd is available at operation.

As in the magnetic memory 120 according to the embodiment, the operating point of the first resistance state can easily be less than Ic2 when the nonlinear first semiconductor device 41 having the high differential resistance RL is used when the magnetoresistive device 10 changes from the second resistance state to the first resistance state. Therefore, a large operation margin is obtained. The yield of the magnetic memory 120 can be increased.

In the magnetic memory 120, the switching device 43 is switched ON. Thereby, the load resistance unit 30 is switched to the second state; and the magnetoresistive device 10 changes from the first resistance state to the second resistance state. In the magnetic memory 120, the load resistance unit 30 is switched to the second state when the current flows between the third electrode 42a and the fourth electrode 42b.

As shown in FIG. 13B, the current I that flows in the magnetoresistive device 10 and the voltage V that is applied to the magnetoresistive device 10 change along the second load line LL2 of the current-voltage characteristics when the magnetoresistive device 10 changes from the first resistance state to the second resistance state.

The second semiconductor device 42 that has the diode connection has nonlinear current-voltage characteristics in which the differential resistance RL increases when the magnetoresistive device 10 changes from the first resistance state to the second resistance state.

The current that flows in the magnetoresistive device 10 must be less than Ic1 after the magnetoresistive device 10 changes from the first resistance state to the second resistance state. As in the embodiment, the nonlinear second semiconductor device 42 that has the low differential resistance RL is used only when the magnetoresistive device 10 changes from the first resistance state to the second resistance state. Thereby, the operating point of the second resistance state can easily be less than Ic1. Therefore, a large operation margin is obtained. Further, the yield of the magnetic memory 120 can be increased.

In the magnetic memory 120, the change of the magnetoresistive device 10 between the second resistance state and the first resistance state can be performed using one power supply electric potential Vdd. Thereby, compared to the magnetic memory 110 that uses two electric potentials Vdd1 and Vdd2, the circuit can be simple.

The electric potential of the power supply terminal 44 may be set to Vdd1 in the first state and Vdd2 in the second state, where Vdd2>Vdd1. In such a case, a larger operation margin is obtained than in the case where Vdd1=Vdd2 and one power supply electric potential is used.

Although the first semiconductor device 41 and the second semiconductor device 42 include p-channel MOSFETs in the description recited above, the first semiconductor device 41 and the second semiconductor device 42 may include n-channel MOSFETs as shown in FIG. 12A and FIG. 12B. In such a case, the second control electrode 42c is electrically connected to the fourth electrode 42b. As shown in FIG. 12A, the first semiconductor device 41 is switched ON; and the switching device 43 is switched OFF. Thereby, the load resistance unit 30 is switched to the first state. As shown in FIG. 12B, the first semiconductor device 41 is switched OFF; and the switching device 43 is switched ON. Thereby, the load resistance unit 30 is switched to the second state.

A MTJ may be used as the magnetoresistive device 10. A GMR device may be used as the magnetoresistive device 10. A spin MOSFET may be used as the magnetoresistive device 10. Although the load resistance unit 30 is connected in series with the magnetoresistive device 10 in the description recited above, the load resistance unit 30 may be connected in parallel with the magnetoresistive device 10. A portion of the load resistance unit 30 may be connected in parallel with the magnetoresistive device 10; and a portion of the load resistance unit 30 may be connected in series with the magnetoresistive device 10.

FIG. 14A to FIG. 14D are circuit diagrams schematically showing magnetic memories according to the second embodiment.

Figure 14A:
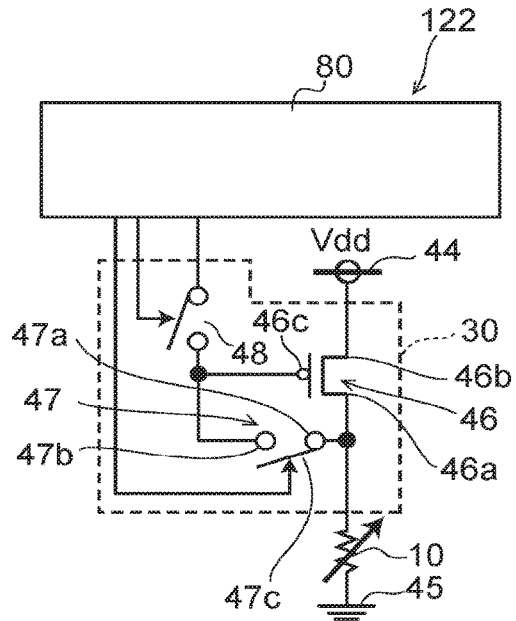
FIGS. 14A to 14D are circuit diagrams schematically showing magnetic memories according to the second embodiment.
Figure 14B:
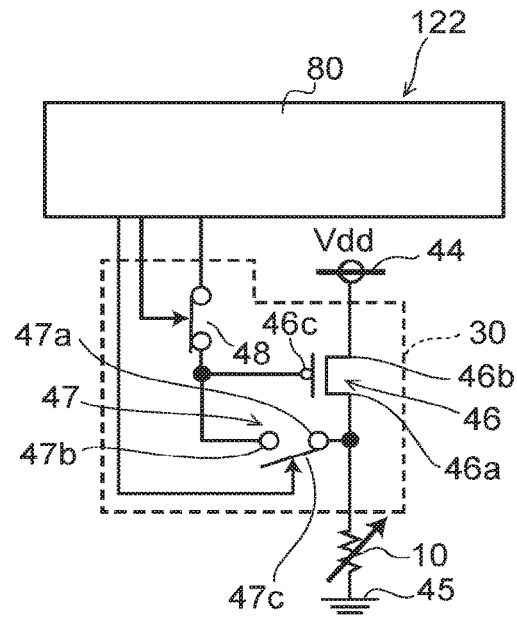
Figure 14C:
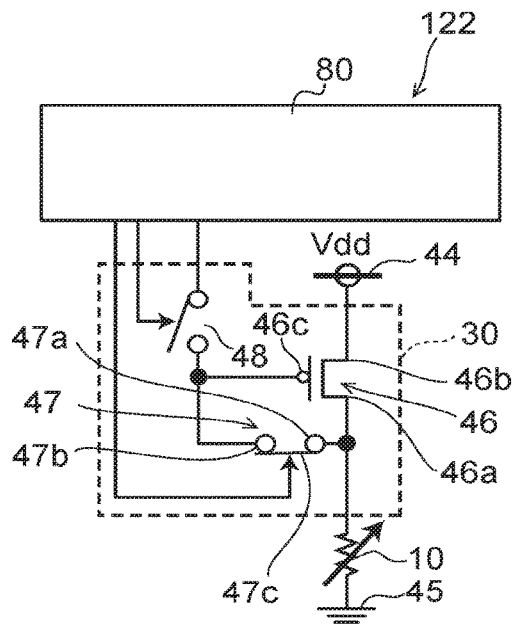

In a magnetic memory 122 as shown in FIG. 14A to FIG. 14C, the load resistance unit 30 includes a semiconductor device 46, a switching device 47, and a switching device 48. The semiconductor device 46 includes, for example, a p-channel MOSFET, an n-channel MOSFET, or the like. The switching device 47 includes a MOSFET, a bipolar transistor, or the like.

The semiconductor device 46 includes a first electrode 46a, a second electrode 46b, and a first control electrode 46c. The first electrode 46a is electrically connected to the magnetoresistive device 10. The second electrode 46b is electrically connected to the power supply terminal 44. The first control electrode 46c controls the current flowing between the first electrode 46a and the second electrode 46b. The first control electrode 46c is electrically connected to the controller 80. The ON/OFF of the semiconductor device 46 is controlled by the controller 80.

The current path between the first electrode 46a and the second electrode 46b is connected in series between the magnetoresistive device 10 and the power supply terminal 44. The semiconductor device 46 may be connected in series between the magnetoresistive device 10 and the power supply terminal 45.

The switching device 47 includes a third electrode 47a, a fourth electrode 47b, and a second control electrode 47c. The third electrode 47a is electrically connected to the first electrode 46a.

The fourth electrode 47b is electrically connected to the first control electrode 46c. The second control electrode 47c controls the current flowing between the third electrode 47a and the fourth electrode 47b. The ON/OFF of the switching device 47 is controlled by the controller 80.

As shown in FIG. 14A to FIG. 14C, the switching device 48 is connected between the first control electrode 46c and the controller 80. The ON/OFF of the switching device 48 is controlled by the controller 80. By switching the switching device 48 ON, voltage is applied to the first control electrode 46c; and the semiconductor device 46 is switched ON. Thus, the voltage that is applied to the first control electrode 46c (the gate electrode) of the semiconductor device 46 is controlled by the controller 80.

As shown in FIG. 14B, the semiconductor device 46 is substantially the same as the first semiconductor device 41 of the magnetic memory 120 when the switching device 47 is OFF and the switching device 48 is ON. As shown in FIG. 14C, when the switching device 47 is switched ON and the switching device 48 is switched OFF, the semiconductor device 46 has a diode connection; and the semiconductor device 46 is substantially the same as the second semiconductor device 42 of the magnetic memory 120.

Accordingly, in the magnetic memory 122, the load resistance unit 30 is switched to the second state by being connected as in FIG. 14C. The load resistance unit is switched to the first state by being connected as in FIG. 14B.

Thus, in the magnetic memory 122 as well, the differential resistance RL of the load resistance is set to be nonlinear in the change of the magnetoresistive device 10 between the first resistance state and the second resistance state. Accordingly, in the magnetic memory 122 as well, the yield can be increased. Further, if the voltage that is applied to the first control electrode 46c in the connection state of FIG. 14B is set to the power supply voltage Vdd, both the change of the magnetoresistive device 10 from the second resistance state to the first resistance state and the change of the magnetoresistive device 10 from the first resistance state to the second resistance state can be performed using one power supply electric potential Vdd; and the circuit can be simple.

Figure 14D:
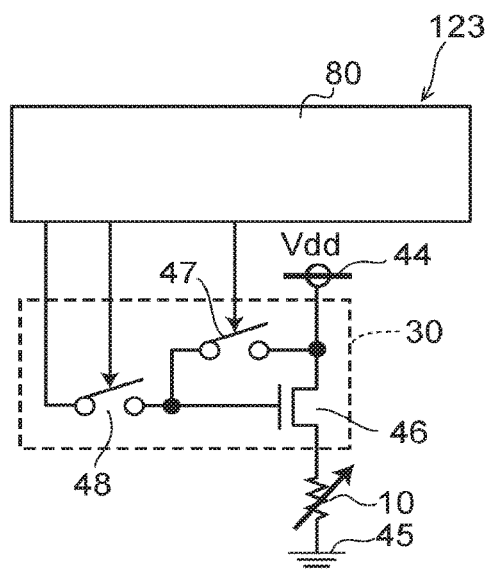

Although the semiconductor device 46 includes a p-channel MOSFET in the embodiment as shown in FIG. 14A to FIG. 14C, an n-channel MOSFET may be used as in a magnetic memory 123 as shown in FIG. 14D.

In the embodiment, a MTJ may be used as the magnetoresistive device 10. In the embodiment, a GMR device may be used as the magnetoresistive device 10. In the embodiment, an n-channel spin MOSFET may be used as the magnetoresistive device 10. In the embodiment, a p-channel MOSFET may be used as the magnetoresistive device 10.

Third Embodiment

Figure 15A:
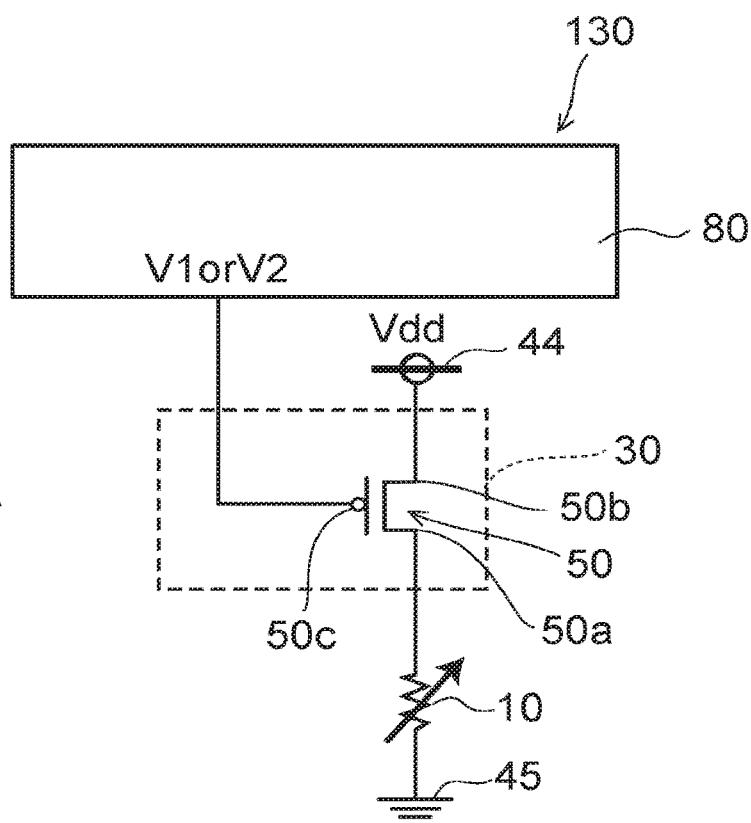
FIGS. 15A and 15B are circuit diagrams schematically showing magnetic memories according to the third embodiment.
Figure 15B:
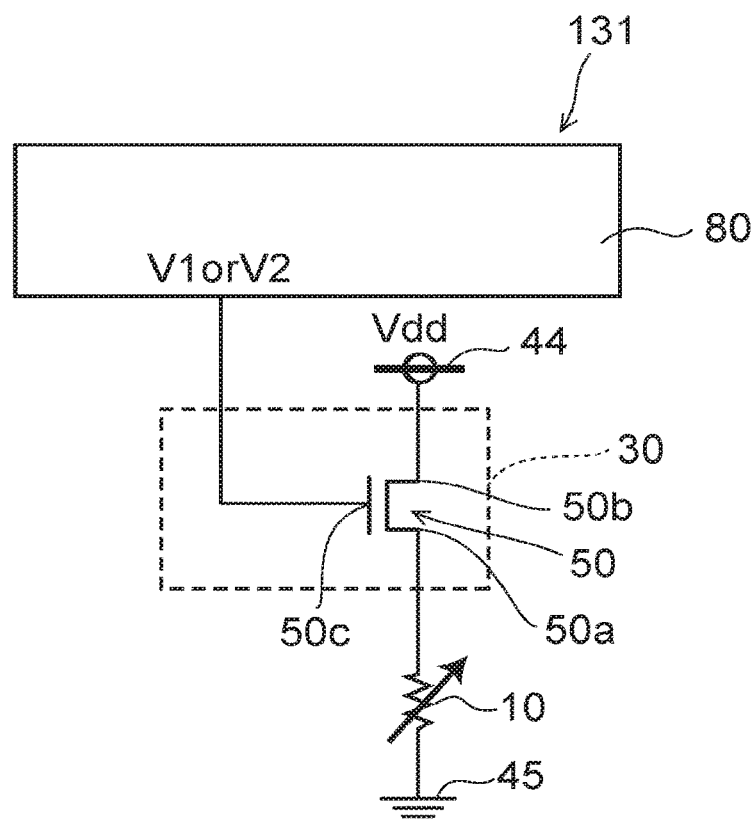

FIG. 15A and FIG. 15B are circuit diagrams schematically showing magnetic memories according to the third embodiment.

In a magnetic memory 130 as shown in FIG. 15A, the load resistance unit 30 includes a semiconductor device 50. The semiconductor device 50 includes a first electrode 50a, a second electrode 50b, and a control electrode 50c. The first electrode 50a is electrically connected to the magnetoresistive device 10. The second electrode 50b is electrically connected to the power supply terminal 44. The control electrode 50c controls the current flowing between the first electrode 50a and the second electrode 50b. The control electrode 50c is electrically connected to the controller 80. The ON/OFF of the semiconductor device 50 is controlled by the controller 80.

When writing the magnetoresistive device 10, first voltage V1 or second voltage V2 is applied to the control electrode 50c. The voltage value of the second voltage V2 is different from the voltage value of the first voltage V1. In the load resistance unit 30, the state is switched to the first state when the first voltage V1 (first control voltage) is applied to the control electrode 50c; and the state is switched to the second state when the second voltage V2 (second control voltage) is applied to the control electrode 50c. Applying the first voltage V1 and the second voltage V2 is performed by the controller 80.

In the case where the semiconductor device 50 is a p-channel MOSFET, the second voltage V2 is lower than the first voltage V1. Thereby, the differential resistance RL of the semiconductor device 50 in the case where the second voltage V2 is applied can be lower than the differential resistance RL of the semiconductor device 50 in the case where the first voltage V1 is applied.

The first voltage V1 and the second voltage V2 are gate voltages of the semiconductor device 50. Thus, the differential resistance RL of the load resistance unit 30 may be changed by changing the gate voltage of the semiconductor device 50.

As shown in FIG. 15B, an n-channel MOSFET may be used as the semiconductor device 50. In such a case, the second voltage V2 is higher than the first voltage V1.

The power supply terminal 44 may be set to the positive electric potential Vdd; and the power supply terminal 45 may be set to the ground electric potential or a negative electric potential. The power supply terminal 44 may be set to the ground electric potential or a negative electric potential; and the power supply terminal 45 may be set to the positive electric potential Vdd.

In the embodiment, a MTJ may be used as the magnetoresistive device 10. In the embodiment, a GMR device may be used as the magnetoresistive device 10. In the embodiment, an n-channel spin MOSFET may be used as the magnetoresistive device 10. In the embodiment, a p-channel spin MOSFET may be used as the magnetoresistive device 10.

Fourth Embodiment

Figure 16A:
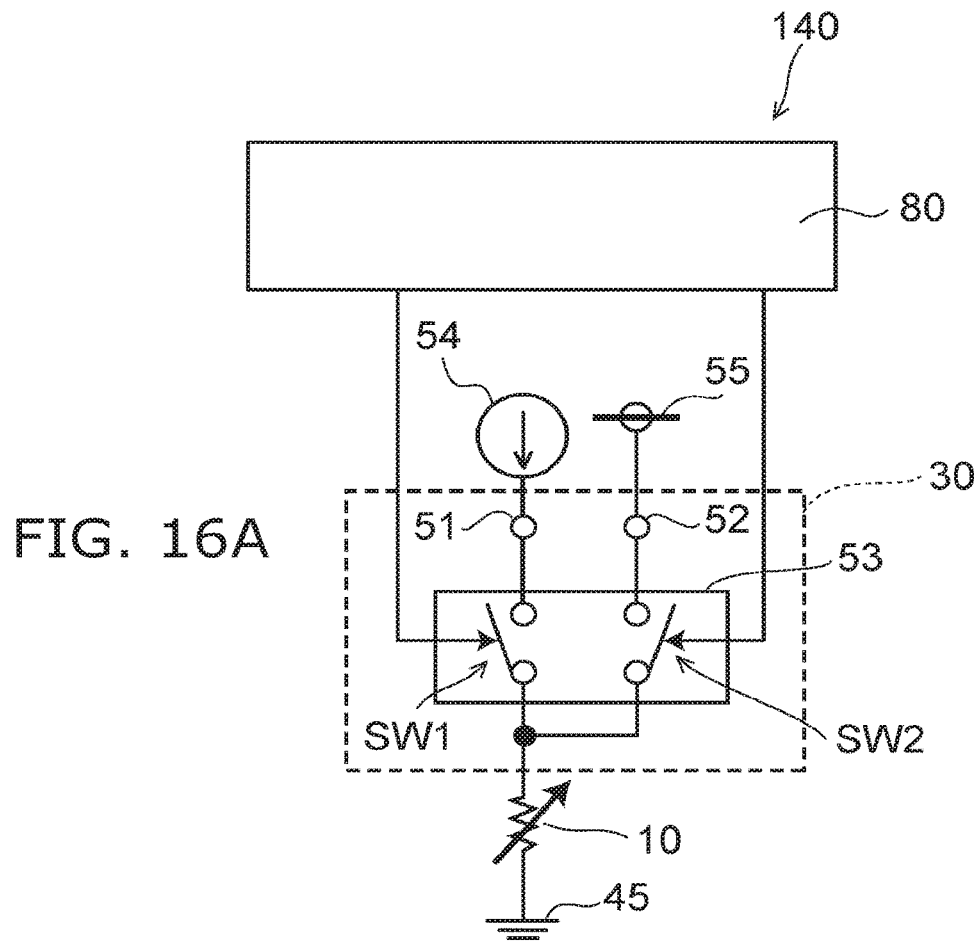
FIGS. 16A to 16C are schematic views showing a magnetic memory according to a fourth embodiment.
Figure 16B:
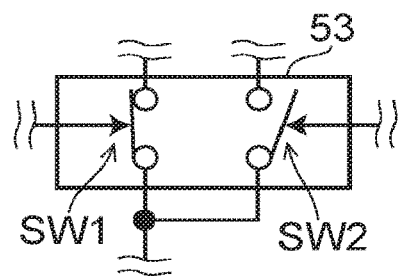
Figure 16C:
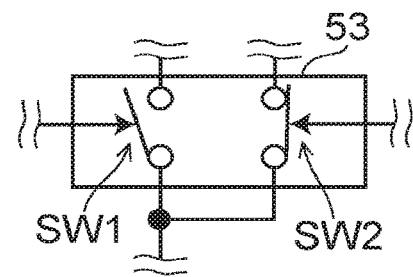

FIG. 16A to FIG. 16C are schematic views showing a magnetic memory according to a fourth embodiment.

FIG. 16A to FIG. 16C are circuit diagrams schematically showing the magnetic memory 140 according to the fourth embodiment.

In the magnetic memory 140 as shown in FIG. 16A, the load resistance unit 30 includes a first terminal 51, a second terminal 52, and a switching unit 53. The first terminal 51 is electrically connected to a constant current source 54. The second terminal 52 is electrically connected to a constant voltage source 55. The switching unit 53 switches the load resistance unit 30 to the first state by electrically connecting the first terminal 51 to the magnetoresistive device 10, and switches the load resistance unit 30 to the second state by electrically connecting the second terminal 52 to the magnetoresistive device 10.

The switching unit 53 includes the first switching device SW1 and the second switching device SW2. The first switching device SW1 is provided between the first terminal 51 and the magnetoresistive device 10. The second switching device SW2 is provided between the second terminal 52 and the magnetoresistive device 10. Thereby, substantially constant current is supplied to the magnetoresistive device 10 at switching the first switching device SW1 ON. Substantially constant voltage is applied to the magnetoresistive device 10 at switching the second switching device SW2 ON.

As shown in FIG. 16B, the first state is the state in which the first switching device SW1 is switched ON and the second switching device SW2 is switched OFF. As shown in FIG. 16C, the second state is the state in which the first switching device SW1 is switched OFF and the second switching device SW2 is switched ON. The switching of ON/OFF of the first switching device SW1 and the second switching device SW2 is controlled by the controller 80. The circuit of the switching unit 53 is not limited to that recited above; and any circuit that can switch the connection of the magnetoresistive device 10, the first terminal 51, and the second terminal 52 may be used.

The constant current source 54 supplies, to the magnetoresistive device 10, current Is that is between the first critical current Ic1 and the second critical current Ic2. Thereby, the magnetoresistive device 10 changes from the second resistance state to the first resistance state due to the supply of the current from the constant current source 54.

The constant voltage source 55 applies, to the magnetoresistive device 10, voltage Vs that is between Ic2×RS1 and Ic1×RS2. Thereby, the magnetoresistive device 10 changes from the first resistance state to the second resistance state due to the supply of the voltage from the constant voltage source 55.

Figure 17A:
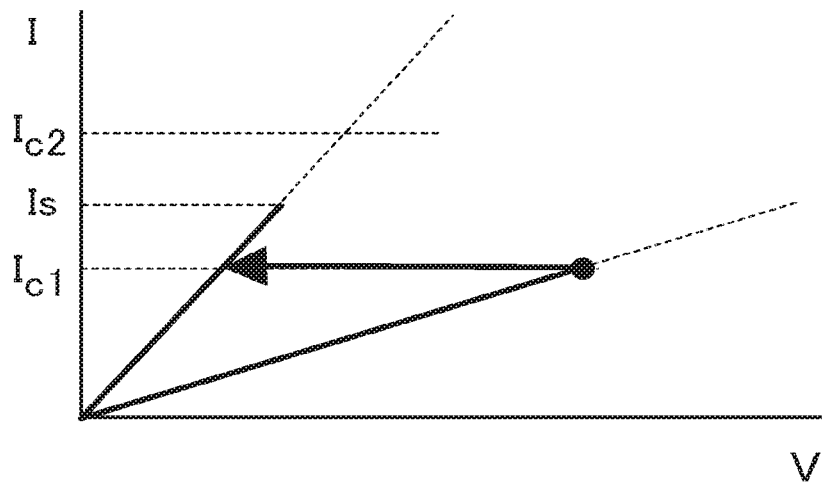
FIGS. 17A and 17B are graphs showing examples of the current-voltage characteristics of the magnetoresistive device according to the fourth embodiment.
Figure 17B:
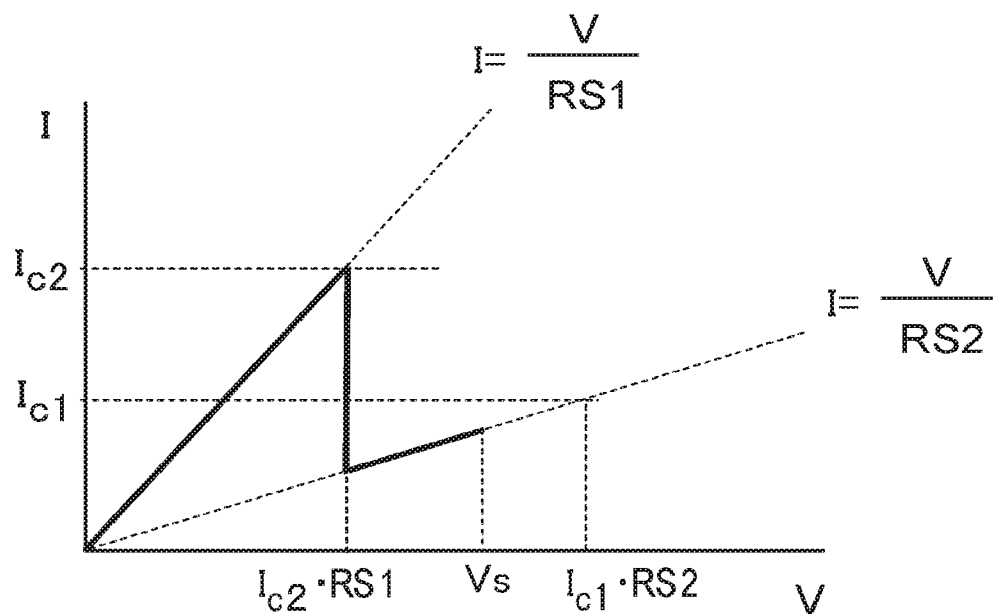

FIG. 17A and FIG. 17B are graphs showing examples of the current-voltage characteristics of the magnetoresistive device according to the fourth embodiment.

FIG. 17A shows the current-voltage characteristics in the case where the magnetoresistive device 10 change from the second resistance state to the first resistance state.

As shown in FIG. 17A, because the substantially constant current is provided by the constant current source 54, the current value does not change even in the change. Therefore, the voltage that is applied to the magnetoresistive device 10 decreases when the magnetoresistive device 10 changes from the second resistance state to the first resistance state.

As shown in FIG. 17B, because the substantially constant voltage is applied to the magnetoresistive device 10 by the constant voltage source 55, the applied voltage value does not change even in the change of the magnetoresistive device 10 between the second resistance state and the first resistance state. Therefore, the current that flows in the magnetoresistive device 10 decreases when the magnetoresistive device 10 changes from the first resistance state to the second resistance state.

A MTJ may be used as the magnetoresistive device 10. A GMR device may be used as the magnetoresistive device 10. A spin MOSFET may be used as the magnetoresistive device 10. The spin MOSFET may be an n-channel-type or a p-channel-type. Although the load resistance unit 30 is connected in series with the magnetoresistive device 10 in the description recited above, the load resistance unit 30 may be connected in parallel with the magnetoresistive device 10. A portion of the load resistance unit 30 may be connected in parallel with the magnetoresistive device 10; and a portion of the load resistance unit 30 may be connected in series with the magnetoresistive device 10.

The constant current source 54 is used in the change from the second resistance state to the first resistance state; and the constant voltage source 55 is used in the change from the first resistance state to the second resistance state. Even in such a case, the writing to the magnetoresistive device 10 can be performed using current in only one direction.

The first terminal 51 and the second terminal 52 are set to positive electric potentials. The power supply terminal 45 is set to the ground electric potential or negative electric potential. The first terminal 51 and the second terminal 52 may be set to the ground electric potential or negative electric potential; and the power supply terminal 45 may be set to positive electric potential.

Devices of First to Fourth Embodiments

The magnetoresistive device 10 of the first to fourth embodiments may include the devices recited below.

Figure 18A:
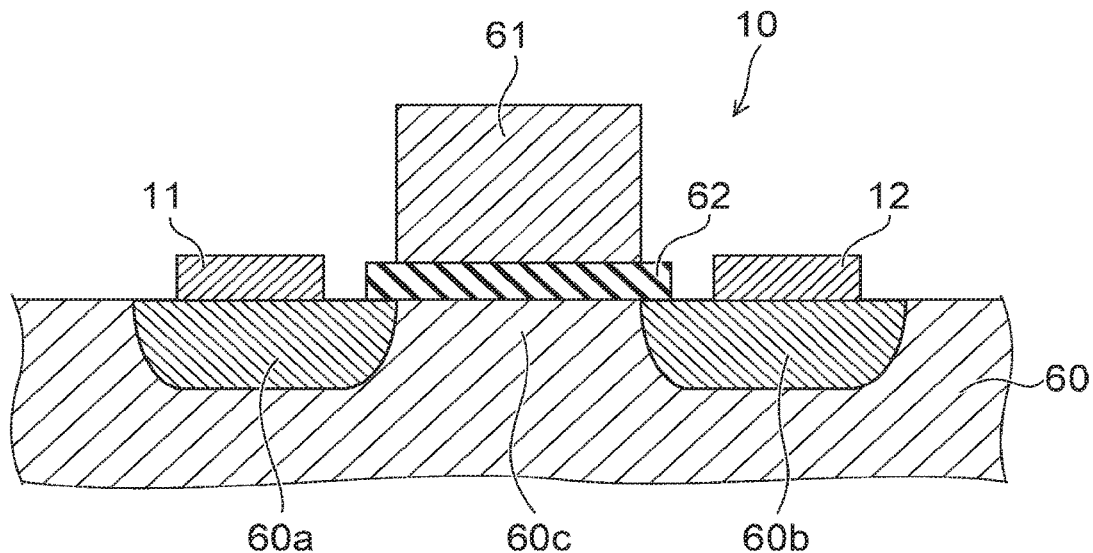
FIGS. 18A and 18B are cross-sectional views schematically showing spin MOSFETs.
Figure 18B:
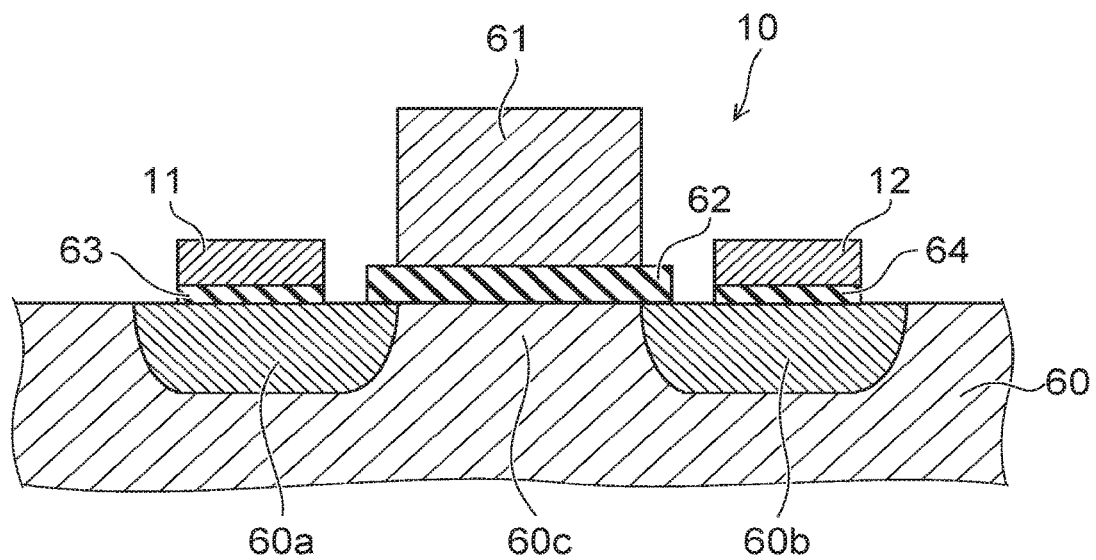

FIG. 18A and FIG. 18B are cross-sectional views schematically showing spin MOSFETs.

As shown in FIG. 18A, the magnetoresistive device 10 includes the first ferromagnetic layer 11, the second ferromagnetic layer 12, a semiconductor layer 60, an electrode 61, and an insulating film 62.

The semiconductor layer 60 includes a first semiconductor portion 60a, a second semiconductor portion 60b, and a third semiconductor portion 60c located between the first semiconductor portion 60a and the second semiconductor portion 60b. The first ferromagnetic layer 11 is provided to face to the first semiconductor portion 60a. The second ferromagnetic layer 12 is provided to face to the second semiconductor portion 60b. The electrode 61 is provided to face to the third semiconductor portion 60c. The insulating film 62 is provided between the third semiconductor portion 60c and the electrode 61. In other words, the first ferromagnetic layer 11 is provided above the first semiconductor portion 60a. The second ferromagnetic layer 12 is provided above the second semiconductor portion 60b. The insulating film 62 is provided on the third semiconductor portion 60c. The electrode 61 is provided on the insulating film 62.

The first semiconductor portion 60a is one of a drain region or a source region. The second semiconductor portion 60b is the other of the drain region or the source region. The third semiconductor portion 60c is a channel region. The electrode 61 is a gate electrode. The insulating film 62 is a gate insulator film.

The electrode 61 is electrically connected to the controller 80. The controller 80 applies voltage to the electrode 61. Thereby, the ON/OFF of the magnetoresistive device 10 is switched. By switching the magnetoresistive device 10 ON, current flows between the first ferromagnetic layer 11 and the second ferromagnetic layer 12. By switching the magnetoresistive device 10 OFF, the current that flows between the first ferromagnetic layer 11 and the second ferromagnetic layer 12 is suppressed. The current substantially no longer flows between the first ferromagnetic layer 11 and the second ferromagnetic layer 12.

In the case where the magnetoresistive device 10 is a spin MOSFET, the magnetoresistive device 10 changes from the second resistance state to the first resistance state by switching the magnetoresistive device 10 ON and switching the load resistance unit 30 to the first state.

In the case where the magnetoresistive device 10 is a spin MOSFET, the magnetoresistive device 10 changes from the first resistance state to the second resistance state by switching the magnetoresistive device 10 ON and switching the load resistance unit 30 to the second state.

Thus, in the magnetic memories 110 to 114, 120 to 123, 130, 131, and 140 in which a spin MOSFET is used as the magnetoresistive device 10 as well, the writing to the magnetoresistive device 10 can be performed using current in only one direction.

The semiconductor layer 60 includes Si, SiGe, GaAs, Ge, AlGaAs, InAs, InGaAs, or a combination of these materials. The semiconductor layer 60 may have a two-dimensional electron gas structure. The electrode 61 and the insulating film 62 are provided when necessary and are omissible.

The magnetoresistive device 10 shown in FIG. 18B includes tunneling barrier layers 63 and 64. The tunneling barrier layer 63 is provided between the first ferromagnetic layer 11 and the first semiconductor portion 60a. The tunneling barrier layer 64 is provided between the second ferromagnetic layer 12 and the second semiconductor portion 60b. The tunneling barrier layers 63 and 64 include an insulator.

Thus, in the spin MOSFET magnetoresistive device 10, a tunneling barrier layer may be provided between the free magnetic layer and the semiconductor layer. Both the tunneling barrier layers 63 and 64 may be provided; or only one of the tunneling barrier layer 63 or 64 may be provided.

Fifth Embodiment

Figure 19:
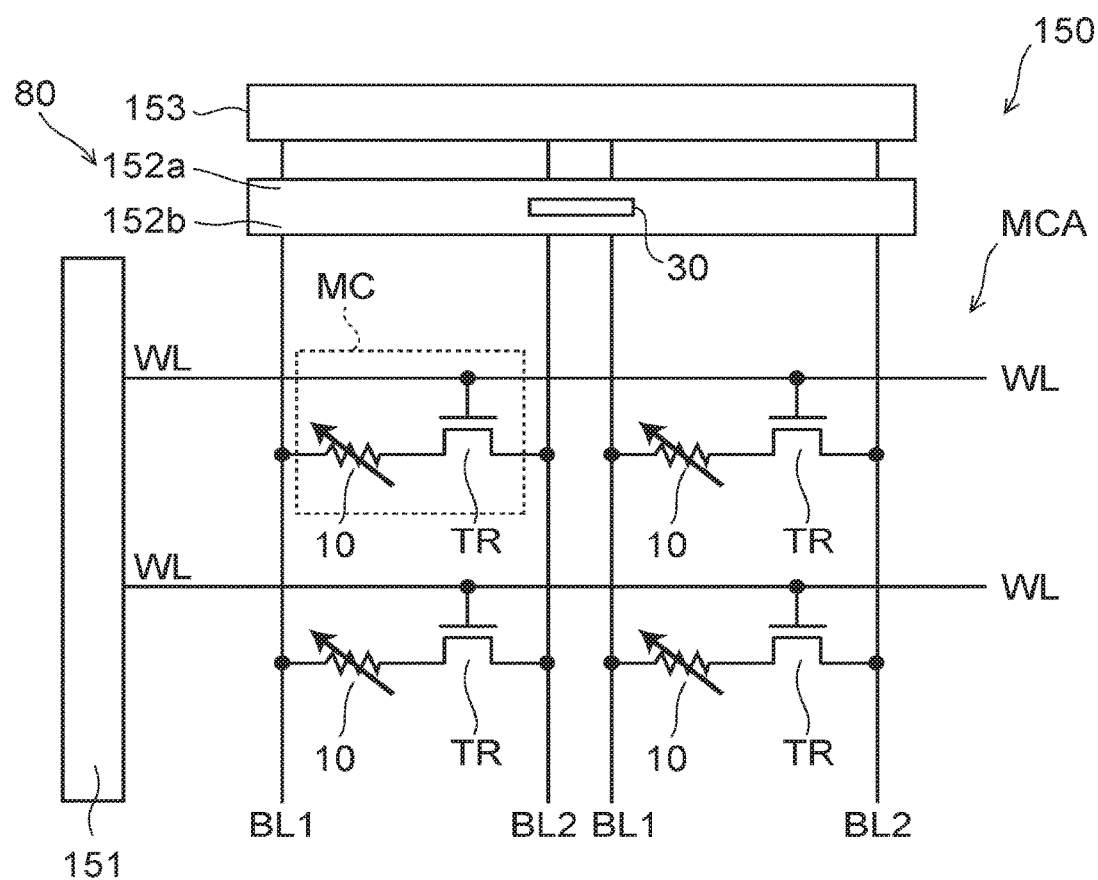
FIG. 19 is a schematic view showing a magnetic memory according to a fifth embodiment.

FIG. 19 is a schematic view showing a magnetic memory according to a fifth embodiment.

As shown in FIG. 19, the magnetic memory 150 according to the embodiment includes a memory cell array MCA. The memory cell array MCA includes multiple memory cells MC arranged in a matrix configuration.

Multiple bit line pairs (including a bit line BL1 and a bit line BL2) and multiple word lines WL are disposed in the memory cell array MCA. Each of the multiple bit line pairs extends in a column direction. Each of the multiple word lines WL extends in a row direction.

The memory cells MC are disposed at the intersections between the bit lines BL1 and the word lines WL. Each of the memory cells MC includes a selection transistor TR and one of the magnetoresistive devices 10 described in the embodiments recited above. One terminal of the magnetoresistive device 10 is connected to the bit line BL1. The other terminal of the magnetoresistive device 10 is connected to the drain terminal of the selection transistor TR. The gate terminal of the selection transistor TR is connected to the word line WL. The source terminal of the selection transistor TR is connected to the bit line BL2.

A row decoder 151 is connected to the word lines WL. A write circuit 152a and a read-out circuit 152b are connected to the bit line pairs (the bit lines BL1 and the bit lines BL2). A column decoder 153 is connected to the write circuit 152a and the read-out circuit 152b.

The controller 80 includes the row decoder 151, the write circuit 152a, the read-out circuit 152b, and the column decoder 153. The controller 80 is electrically connected to each of the multiple memory cells MC (the multiple magnetoresistive devices 10) via the bit lines BL1, the word lines WL, the selection transistors TR, etc. The controller 80 performs the writing of data and the reading of the data to each of the multiple memory cells MC.

A resistor and a selection transistor that are provided in the write circuit 152a are used as the load resistance unit 30. The bit line BL1 and the bit line BL2 that are selected by the column decoder 153 are electrically connected to the load resistance unit 30. Thereby, the load resistance unit 30 is electrically connected to the magnetoresistive device 10 of the memory cell MC selected by the row decoder 151 and the column decoder 153. As described in the embodiments recited above, the writing of the magnetoresistive device 10 can be performed using unidirectional current. Any of the configurations described in the embodiments recited above may be employed as the load resistance unit 30.

The load resistance unit 30 may be provided in the memory cell MC. Multiple load resistance units 30 may be provided respectively in the multiple memory cells MC. The load resistance unit 30 may be used as the selection transistor TR.

Each of the memory cells MC is selected by the row decoder 151 and the column decoder 153. An example of the data writing to the memory cell MC is as follows. First, the word line WL that is connected to the memory cell MC for the data writing is activated to select the memory cell MC. Thereby, the selection transistor TR is switched ON.

Unidirectional writing current is supplied to the magnetoresistive device 10. In the case where the writing current is supplied to the magnetoresistive device 10 from the bit line BL1 to the bit line BL2, the write circuit 152a applies voltage to the bit lines BL1 and BL2; but the electric potential that is applied to the bit line BL2 is lower than that of the bit line BL1. In the case where the writing current is supplied to the magnetoresistive device 10 from the bit line BL2 to the bit line BL1, the write circuit 152a applies voltage to the bit line BL1 and the bit line BL2; but the electric potential that is applied to the bit line BL1 is lower than that of the bit line BL2. Thus, the datum "0" or the datum "1" can be written to the memory cell MC.

An example of the data read-out from the memory cell MC is as follows. First, the memory cell MC is selected. The read-out circuit 152b supplies, to the magnetoresistive device 10, read-out current that flows in a direction from the selection transistor TR toward the magnetoresistive device 10. Then, the read-out circuit 152b senses the resistance value of the magnetoresistive device 10 based on the read-out current. Thus, the information that is stored in the magnetoresistive device 10 can be read.

Thereby, for any memory cell MC of the memory cell array MCA, the data can be written to the magnetoresistive device 10, or the data that is written to the magnetoresistive device 10 can be read. In the magnetic memory 150 as well, the writing can be performed using unidirectional current; and the circuit scale of the peripheral circuit can be reduced. Higher integration of the magnetic memory 150 is possible.

In the writing of the magnetoresistive device 10, the current that flows in the magnetoresistive device 10 has the same direction for both the change from the second resistance state to the first resistance state and the change from the first resistance state to the second resistance state.

The magnetoresistive effect device 10 may be a MTJ. The magnetoresistive device 10 may be a GMR device. The magnetoresistive device 10 may be an n-channel spin MOSFET. The magnetoresistive device 10 may be a p-channel spin MOSFET.

Sixth Embodiment

Figure 20:
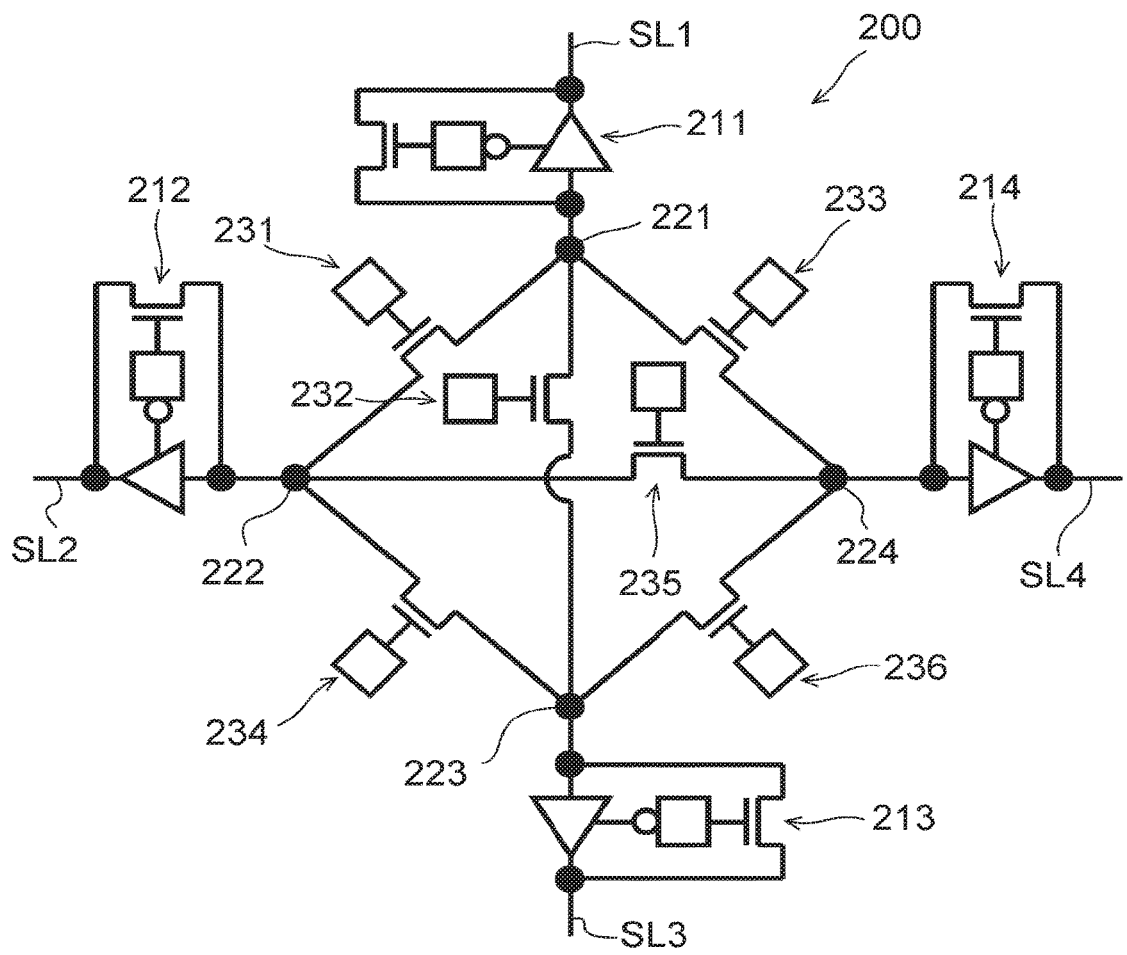
FIG. 20 is a circuit diagram schematically showing a semiconductor-integrated-circuit according to a sixth embodiment.

FIG. 20 is a circuit diagram schematically showing a semiconductor-integrated-circuit according to a sixth embodiment.

As shown in FIG. 20, the semiconductor-integrated-circuit 200 includes four signal lines SL1 to SL4, four input/output units 211 to 214, four connection nodes 221 to 224, and six memory-inclusive pass transistor circuits 231 to 236. The semiconductor-integrated-circuit 200 is a so-called switching box circuit. The switching box circuit is a circuit that determines connections and disconnections in a region where signal lines merge from four directions. The switching box circuit determines the connections and disconnections of the four signal lines SL1, SL2, SL3, and SL4.

FIG. 21A, FIG. 21B, FIG. 22A, and FIG. 22B are circuit diagrams schematically showing the memory-inclusive pass transistor circuit.

Figure 21A:
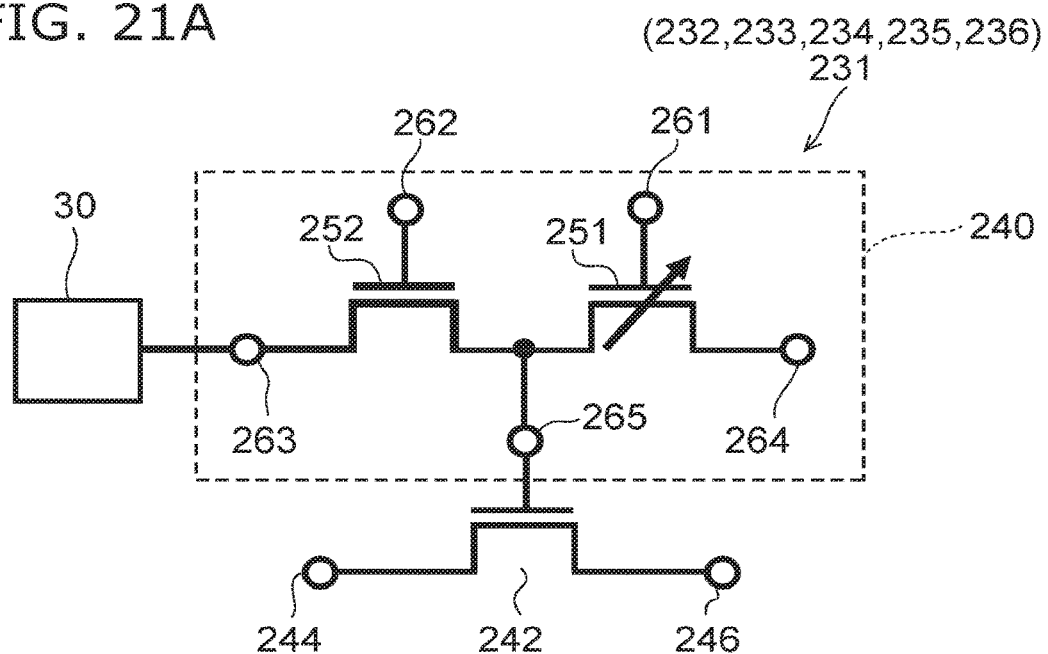
FIGS. 21A and 21B are circuit diagrams schematically showing the memory-inclusive pass transistor circuit.

As shown in FIG. 21A, the memory-inclusive pass transistor circuits 231 to 236 include a memory circuit 240, a pass transistor 242, and the load resistance unit 30. The memory-inclusive pass transistor circuit 231 is a so-called memory function-inclusive pass transistor circuit. The load resistance unit 30 includes any of the configurations described in the embodiments recited above.

The memory circuit 240 includes a spin MOSFET 251 (a magnetoresistive device) and a MOSFET 252. The spin MOSFET 251 is an n-channel spin MOSFET. The spin MOSFET 251 may include the configurations described in regard to FIG. 8B, FIG. 8C, FIG. 18A, or FIG. 18B.

The MOSFET 252 is an n-channel MOSFET. An n-channel spin MOSFET may be used as the MOSFET 252.

Figure 21B:
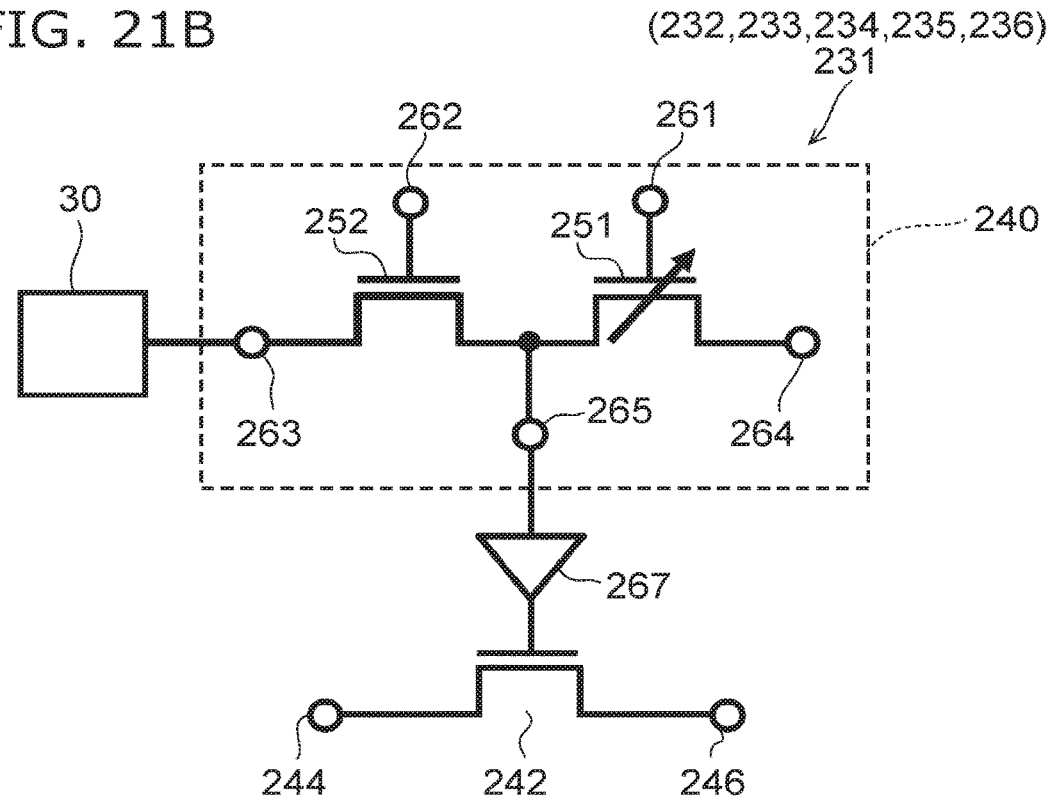
Figure 22A:
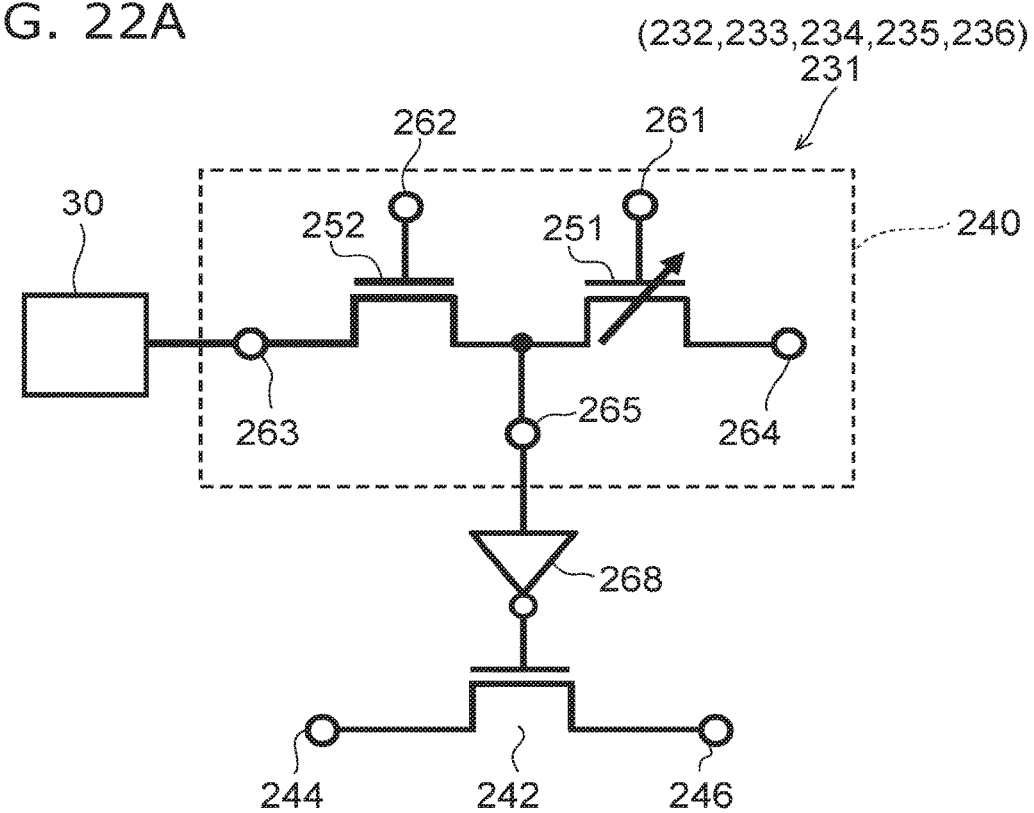
FIGS. 22A and 22B are circuit diagrams schematically showing the memory-inclusive pass transistor circuit.

As shown in FIG. 21B, the circuit may be such that the output of the memory is stabilized using a buffer 267. As shown in FIG. 22A, the circuit may be such that the output of the memory is stabilized using an inverter 268.

The gate electrode of the spin MOSFET 251 is connected to a terminal 261. One of the source electrode or the drain electrode of the spin MOSFET 251 is connected to a terminal 264; and the other is connected to a terminal 265.

The MOSFET 251 may be a p-channel MOSFET; and the MOSFET 252 may be a p-channel MOSFET. The MOSFETs 251 and 252 may be p-channel MOSFETs.

The gate electrode of the MOSFET 252 is connected to a terminal 262. One of the source electrode or the drain electrode of the MOSFET 252 is connected to the terminal 265; and the other is connected to a terminal 263.

The load resistance unit 30 is connected to the terminal 263. The load resistance unit 30 may be connected to the terminal 264. The load resistance units 30 may be provided respectively for the pass transistor circuits 231 to 236; or one load resistance unit 30 may be connected to the spin MOSFETs 251 of the pass transistor circuits 231 to 236 via switches, etc.

The pass transistor 242 includes an n-channel MOSFET. The pass transistor 242 may be a p-channel MOSFET. The gate of the pass transistor 242 is connected to the terminal 265 of the memory circuit 240. One of the source electrode or the drain electrode of the pass transistor 242 is connected to a first input/output terminal 244. The other of the source electrode or the drain electrode of the pass transistor 242 is connected to a second input/output terminal 246.

In the memory-inclusive pass transistor circuit 231, the electric potential of the terminal 265 of the memory circuit 240 is high voltage or low voltage depending on the resistance state of the spin MOSFET 251 inside the memory circuit 240. Thereby, the connected or disconnected state can be switched between the first input/output terminal 244 and the second input/output terminal 246. In other words, the conducting or disconnected state of the pass transistor 242 can be selected according to the content of the memory.

The output voltage can be stabilized at one of a value near the reference voltage GND or a value near the power supply voltage Vdd according to the resistance state of the spin MOSFET 251, the resistance state of the spin MOSFET 252, or the resistance states of the spin MOSFET 251 and the spin MOSFET 252. Thus, in the memory circuit 240, a stable binary output is obtained using the resistance states of the spin MOSFETs 251 and 252.

The writing operation of the memory circuit 240 is described below.

In the writing of the memory circuit 240, the writing of the resistance state of the spin MOSFET 251 is performed by the spin injection magnetization reversal. In other words, the resistance state is changed by current not less than the critical current to flow between the source and drain of the spin MOSFET 251.

When performing the writing of the spin MOSFET 251, the spin MOSFET 251 is switched ON; and the MOSFET 252 is switched ON by applying high voltage to the gate electrode of the MOSFET 252. Then, as described in the embodiments recited above, current flows between the terminal 263 and the terminal 264 via the load resistance unit 30. Thereby, the resistance state of the spin MOSFET 251 can change.

Figure 22B:
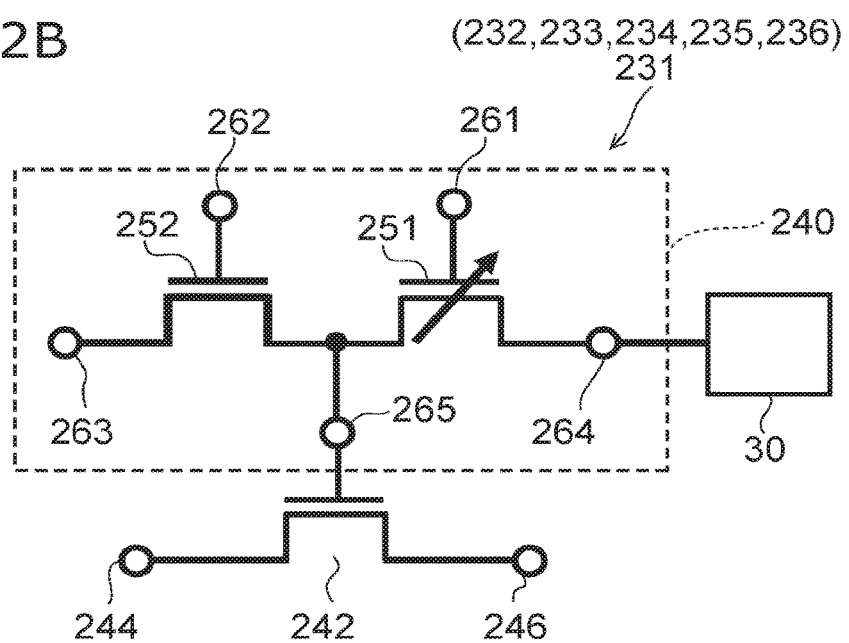

As shown in FIG. 22B, the load resistance unit 30 may be connected to the terminal 264; and the resistance state of the spin MOSFET 251 may change.

The MOSFET 251 may be an n-channel MOSFET; and the MOSFET 252 may be an n-channel spin MOSFET. Both the MOSFET 251 and the MOSFET 252 may be n-channel spin MOSFETs.

The MOSFET 251 may be a p-channel spin MOSFET; and the MOSFET 252 may be a p-channel MOSFET. The MOSFET 251 may be a p-channel MOSFET; and the MOSFET 252 may be a p-channel spin MOSFET. Both the MOSFET 251 and the MOSFET 252 may be p-channel spin MOSFETs.

In FIG. 20, the four signal lines SL1 to SL4 are disposed respectively in four directions. The signal line SL1 is disposed to the top; the signal line SL2 is disposed to the left; the signal line SL3 is disposed to the bottom; and the signal line SL4 is disposed to the right. The input/output units 211 to 214 are connected respectively to the signal lines SL1 to SL4. The connection nodes 221 to 224 are connected respectively to the input/output units 211 to 214.

One of the first input/output terminal 244 or the second input/output terminal 246 of the memory-inclusive pass transistor circuit 231 is connected to the connection node 221; and the other is connected to a connection node 222.

One of the first input/output terminal 244 or the second input/output terminal 246 of a memory-inclusive pass transistor circuit 232 is connected to the connection node 221; and the other is connected to a connection node 223.

One of the first input/output terminal 244 or the second input/output terminal 246 of a memory-inclusive pass transistor circuit 233 is connected to the connection node 221; and the other is connected to the connection node 224.

One of the first input/output terminal 244 or the second input/output terminal 246 of a memory-inclusive pass transistor circuit 234 is connected to the connection node 222; and the other is connected to the connection node 223.

One of the first input/output terminal 244 or the second input/output terminal 246 of a memory-inclusive pass transistor circuit 235 is connected to the connection node 222; and the other is connected to the connection node 224.

One of the first input/output terminal 244 or the second input/output terminal 246 of the memory-inclusive pass transistor circuit 236 is connected to the connection node 223; and the other is connected to the connection node 224.

Accordingly, any one signal line can be connected to any other signal line via the input/output unit, the connection node, the pass transistor circuit, the connection node, and the input/output unit. The signal line SL1 is connected to the signal line SL2 via the route including the input/output unit 211, the connection node 221, the memory-inclusive pass transistor circuit 231, the connection node 222, and an input/output unit 212.

Thus, in the semiconductor-integrated-circuit 200, the connection and disconnection of the signal lines SL1 to SL4 can be switched using the resistance state of the spin MOSFET 251 included in the memory circuit 240 of the pass transistor circuits 231 to 236. In the memory circuit 240 as well, the writing can be performed using unidirectional current; and the circuit scale of the peripheral circuit can be reduced. Accordingly, higher integration of the semiconductor-integrated-circuit 200 is possible. If the semiconductor-integrated-circuit 200 is used, a reconfigurable logic circuit with high-speed and low power consumption can be realized. If the semiconductor-integrated-circuit 200 is used, a field programmable gate array with high-speed and low power consumption can be realized. A highly-integrated field programmable gate array can be realized.

Seventh Embodiment

Figure 23:
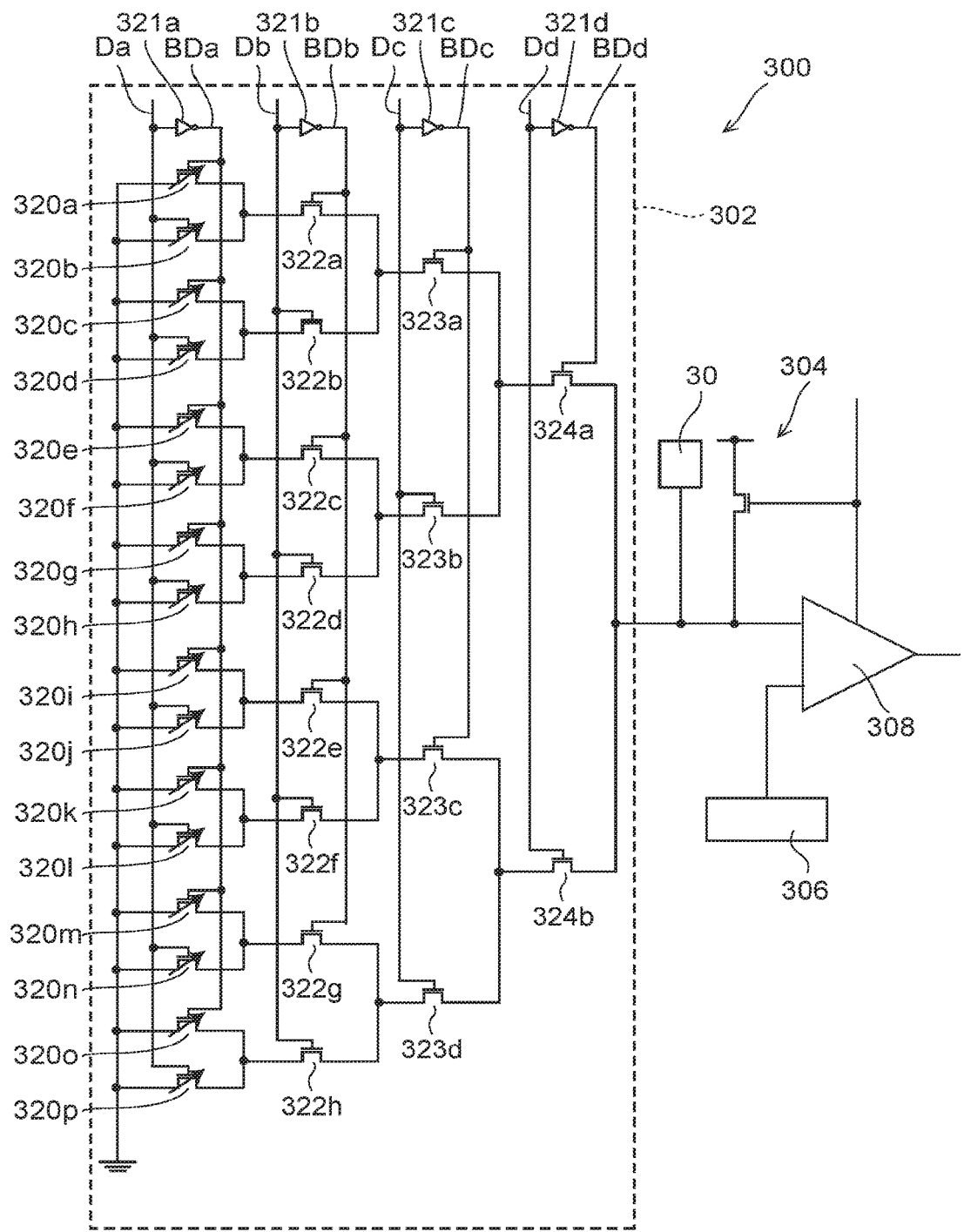
FIG. 23 is a circuit diagram schematically showing a semiconductor-integrated-circuit according to a seventh embodiment.

FIG. 23 is a circuit diagram schematically showing a semiconductor-integrated-circuit according to a seventh embodiment.

As shown in FIG. 23, the semiconductor-integrated-circuit 300 includes a memory-inclusive multiplexer 302, the current supply source 304, a reference unit 306, a comparator 308, and the load resistance unit 30. The semiconductor-integrated-circuit 300 is an example of a reconfigurable logic circuit. The semiconductor-integrated-circuit 300 is a so-called lookup table circuit.

The multiplexer 302 is a four-input one-output multiplexer. The multiplexer 302 includes four control lines Da to Dd, four inversion control lines BDa to BDd, sixteen spin MOSFETs 320a to 320p (magnetoresistive devices), four inverters 321a to 321d, eight MOSFETs 322a to 322h, four MOSFETs 323a to 323d, and two MOSFETs 324a and 324b.

n-channel spin MOSFETs are used as the spin MOSFETs 320a to 320p. The spin MOSFETs 320a to 320p may include the configuration described in regard to FIG. 13B, FIG. 15A, or FIG. 15B. n-channel MOSFETs are used as the MOSFETs 322a to 322h, the MOSFETs 323a to 323d, and the MOSFETs 324a and 324b.

The input terminals of the inverters 321a to 321d are connected respectively to the control lines Da to Dd. The output terminals of the inverters 321a to 321d are connected respectively to the inversion control lines BDa to BDd. In other words, the control signals that flow through the inversion control lines BDa to BDd are the inversion of the control signals flowing through the control lines Da to Dd.

The sources of the spin MOSFETs 320a to 320p are connected to the reference voltage GND. The gates of the spin MOSFETs 320a, 320c, 320e, 320g, 320i, 320k, 320m, and 320o are connected to the inversion control line BDa. The gates of the spin MOSFETs 320b, 320d, 320f, 320h, 320j, 320l, 320n, and 320p are connected to the control line Da.

The drains of the spin MOSFETs 320a and 320b are connected to the source of the MOSFET 322a. The drains of the spin MOSFETs 320c and 320d are connected to the source of the MOSFET 322b. The drains of the spin MOSFETs 320e and 320f are connected to the source of the MOSFET 322c. The drains of the spin MOSFETs 320g and 320h are connected to the source of the MOSFET 322d. The drains of the spin MOSFETs 320i and 320j are connected to the source of the MOSFET 322e. The drains of the spin MOSFETs 320k and 320l are connected to the source of the MOSFET 322f. The drains of the spin MOSFETs 320m and 320n are connected to the source of the MOSFET 322g. The drains of the spin MOSFETs 320o and 320p are connected to the source of the MOSFET 322h.

The gates of the MOSFETs 322a, 322c, 322e, and 322g are connected to the inversion control line BDb. The gates of the MOSFETs 322b, 322d, 322f, and 322h are connected to the control line Db.

The drains of the MOSFETs 322a and 322b are connected to the source of the MOSFET 323a. The drains of the MOSFETs 322c and 322d are connected to the source of the MOSFET 323b. The drains of the MOSFETs 322e and 322f are connected to the source of the MOSFET 323c. The drains of the MOSFETs 322g and 322h are connected to the source of the MOSFET 323d.

The gates of the MOSFETs 323a and 323c are connected to the inversion control line BDc. The gates of the MOSFETs 323b and 323d are connected to the control line Dc. The drains of the MOSFETs 323a and 323b are connected to the source of the MOSFET 324a. The drains of the MOSFETs 323c and 323d are connected to the source of the MOSFET 324b.

The gate of the MOSFET 324a is connected to the inversion control line BDd. The gate of the MOSFET 324b is connected to the control line Dd. The drains of the MOSFETs 324a and 324b are connected to a first input terminal of the comparator 308.

In the multiplexer 302, by controlling the electric potential levels of the four control lines Da to Dd, one spin MOSFET can be selected from the sixteen spin MOSFETs 320a to 320p; and the first input terminal of the comparator 308 can be electrically connected to the reference voltage GND via the selected spin MOSFET. In other words, the MOSFETs 322a to 322h, the MOSFETs 323a to 323d, and the MOSFETs 324a and 324b are selectors for selecting one spin MOSFET from the spin MOSFETs 320a to 320p.

The current supply source 304 supplies current to the selected spin MOSFET from the first input terminal of the comparator 308. The reference unit 306 sets a second input terminal of the comparator 308 to electric potential used as a reference.

The comparator 308 compares the electric potential of the second input terminal set by the reference unit 306 with the electric potential of the first input terminal when the current is supplied from the current supply source 304 to the selected spin MOSFET. Thereby, the comparator 308 reads the resistance value of the selected spin MOSFET and discriminates the resistance state of the selected spin MOS- FET. Then, the comparator 308 outputs a signal corresponding to the resistance state of the selected spin MOSFET from the output terminal.

The comparator 308 outputs a low voltage level when the selected spin MOSFET is in the first resistance state and outputs a high voltage level when the selected spin MOSFET is in a second resistance state. The relationship between the output from the comparator 308 at the high voltage level or at the low voltage level and the resistance state of the spin MOSFET in the first resistance state or in the second resistance state may be reverse to that recited above.

The load resistance unit 30 is connected to the drains of the MOSFETs 324a and 324b. Any of the load resistance units 30 described in the embodiments recited above may be used as the load resistance unit 30. In addition to the resistance of the load resistance unit 30, the load resistance for the spin MOSFETs 320a to 320p includes the resistance of one of the MOSFETs of the MOSFETs 322a to 322h, the resistance of one of the MOSFETs of the MOSFETs 323a to 323d, and the resistance of one of the MOSFETs of the MOSFETs 324a to 324b. When writing the spin MOSFET, the desired spin MOSFET is selected by inputting the input signals to the control lines Da to Dd. Then, as described in the embodiments recited above, the writing current flows from the load resistance unit 30 toward the spin MOSFET. Thereby, the resistance state of the selected spin MOSFET can change.

Thus, in the semiconductor-integrated-circuit 300, the output from the comparator 308 can change according to the resistance state of the spin MOSFETs 320a to 320p. Any logic can be stored in a field programmable gate array. In the semiconductor-integrated-circuit 300 as well, the writing of the spin MOSFETs 320a to 320p can be performed using unidirectional current. Therefore, the circuit scale of the peripheral circuit can be reduced. Accordingly, higher integration of the semiconductor-integrated-circuit 300 is possible. If the semiconductor-integrated-circuit 300 is used, a reconfigurable logic circuit with high speed and low power consumption can be realized. If the semiconductor-integrated-circuit 300 is used, a field programmable gate array with high speed and low power consumption can be realized. A highly-integrated field programmable gate array can be realized.

The following may be used in the embodiments described above.

The ferromagnet material of the first ferromagnetic layer 11 and the second ferromagnetic layer 12 may be at least one type of thin film selected from the group consisting of the elemental metals of Ni, Fe, and Co, alloys of Ni, Fe, and Co, compounds of Ni, Fe, and Co, a CoFeB amorphous material, an amorphous material such as (Co, Fe, Ni)—(Si, B), (Co, Fe, Ni)—(Si, B)—(P, Al, Mo, Nb, Mn) system, Co—(Zr, Hf, Nb, Ta, Ti)-system, etc., and a Heusler alloy with a composition near $X_2YZ$, where X is Co, Y includes one or more elements of V, Cr, Mn, or Fe, and Z includes one or more elements of Al, Si, Ga, or Ge, or may be a stacked film of the thin films.

The ferromagnet material of the first ferromagnetic layer and the second ferromagnetic layer 12 may be a perpendicular magnetization material of FePt, CoPt, CoCrPt, an alloy including one of (Co, Fe, Ni)—(Pt, Ir, Pd, Rh)—(Cr, Hf, Zr, Ti, Al, Ta, Nb), or a stacked film of one of (Co, Fe)/(Pt, Ir, Pd).

Nonmagnetic elements such as Ag (silver), Cu (copper), Au (gold), Al (aluminum), Ru (ruthenium), Os (osmium), Re (rhenium), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium), etc., can be doped in the first ferromagnetic layer 11 and the second ferromagnetic layer 12 not only to adjust the magnetic properties but also to adjust various properties such as the crystallinity, the mechanical properties, the chemical properties, etc.

The material of the nonmagnetic layer 15 may include one insulator of $Al_2O_3$ (aluminum oxide), $SiO_2$ (silicon oxide), MgO (magnesium oxide), AlN (aluminum nitride), SiN (silicon nitride), $Bi_2O_3$ (bismuth oxide), $MgF_2$ (magnesium fluoride), $CaF_2$ (calcium fluoride), $SrTiO_3$ (strontium titanate), $LaAlO_3$ (lanthanum aluminate), Al—N—O (aluminum oxynitride), or HfO (hafnium oxide), or may include combined films being a combination of the multiple insulators.

The material of the nonmagnetic layer 15 may include copper, silver, gold, chrome, or platinum. The material of the nonmagnetic layer 15 may be current confinement including copper, silver, gold, chrome, or platinum in insulator.

The semiconductor material of the semiconductor layer 60 of the spin MOSFET may include a silicon single crystal. The semiconductor material of the semiconductor layer 60 may be a single crystal of carbon, silicon, or germanium, or a single crystal of a compound of carbon, silicon, germanium, gallium, arsenic, indium, aluminum, antimony, or tin.

The electrode 61 of the spin MOSFET may include polycrystal silicon doping impurities. The electrode 61 of the spin MOSFET may include a metal gate made of a metal material; and the insulating film 62 of the spin MOSFET may include a high dielectric constant material having a relative dielectric constant of 4 or more.

The doping material for forming the p-type region of the spin MOSFET may include one or more elements of boron, aluminum, gallium, indium, palladium, carbon, platinum, gold, or oxygen.

The doping material for forming the n-type region of the spin MOSFET may include one or more elements of antimony, phosphorus, arsenic, titanium, carbon, platinum, gold, or oxygen.

In the spin MOSFET, the tunneling barrier layers 63 and 64 may be provided at the interfaces of the semiconductor and the ferromagnet. The materials of the tunneling barrier layers 63 and 64 at the interfaces of the semiconductor and the ferromagnet may include silicon, aluminum, magnesium, germanium, titanium, or zirconium or may be an oxide, a nitride, or a fluoride of those recited above.

The semiconductor material of the spin MOSFET may include GaAs. The gate material on the GaAs semiconductor may include Ti/Pt/Au. There may not be a gate insulator film between the GaAs semiconductor and the gate. The doping material for forming the n-type region in the GaAs semiconductor may include one or more elements of S, Se, Sn, Te, Si, C, or O. The doping material for forming the p-type region in the GaAs semiconductor may include one or more elements of Be, Mg, Zn, Cd, Si, C, Cu, or Cr.

According to the embodiments, a highly-integrated magnetic memory and semiconductor-integrated-circuit are provided.

In the specification of the application, "parallel" includes not only strictly parallel but also, for example, the variation due to manufacturing processes, etc.; and it is sufficient to be substantially parallel. In the specification of the application, the state of being "provided on" includes not only the state of being provided in direct contact but also the state of being provided with another component inserted therebetween. The state of being "stacked" includes not only the state of being overlaid with mutual contact but also the state of being overlaid with another component inserted therebetween. The state of being "faced" includes not only the state of directly facing each other but also the state of facing each other with another component inserted therebetween. In the specification of the application, being "electrically connected" includes not only the case of being connected in direct contact but also the case of being connected via another conductive material, etc.

Hereinabove, embodiments of the invention are described with reference to specific examples. However, the embodiments of the invention are not limited to these specific examples. For example, one skilled in the art may similarly practice the invention by appropriately selecting specific configurations of components included in magnetic memories and semiconductor-integrated-circuits such as magnetoresistive devices, first ferromagnetic layers, second ferromagnetic layers, nonmagnetic layers, load resistance units, first resistance devices, second resistance devices, controllers, constant current sources, constant voltage sources, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all magnetic memories and semiconductor-integrated-circuits practicable by an appropriate design modification by one skilled in the art based on the magnetic memories and the semiconductor-integrated-circuits described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory, comprising:
    a magnetoresistive device having a first resistance state and a second resistance state and including a first ferromagnetic layer and a second ferromagnetic layer, a direction of magnetization of the first ferromagnetic layer being changeable, a direction of magnetization of the second ferromagnetic layer being changeable, resistance between the first ferromagnetic layer and the second ferromagnetic layer being higher in the second resistance state than in the first resistance state;
    a load resistance unit electrically connected to the magnetoresistive device, the load resistance unit having a first state and a second state, differential resistance of the load resistance unit at the second state being lower than differential resistance of the load resistance unit at the first state; and
    a controller switching the magnetoresistive device to the first resistance state by current flowing in a first direction between the first ferromagnetic layer and the second ferromagnetic layer with the load resistance unit being set to the first state, the controller switching the magnetoresistive device to the second resistance state by current flowing in the first direction between the first ferromagnetic layer and the second ferromagnetic layer with the load resistance unit being set to the second state.

2. The memory according to claim 1, wherein
    first critical current where the magnetoresistive device changes from the second resistance state to the first resistance state is smaller than second critical current where the magnetoresistive device changes from the first resistance state to the second resistance state,
    the current flowing in the magnetoresistive device in the first resistance state after the magnetoresistive device changes from the second resistance state to the first resistance state by the current flowing in the first direction is smaller than the second critical current, and
    the current flowing in the magnetoresistive device in the second resistance state after the magnetoresistive device changes from the first resistance state to the second resistance state by the current flowing in the first direction is smaller than the first critical current.

3. The memory according to claim 2, wherein
    the value of differential resistance RL1 is greater than (Ic1×RS2−Ic2×RS1)/(Ic2−Ic1), and
    the value of differential resistance RL2 is less than (Ic1×RS2−Ic2×RS1)/(Ic2−Ic1), where
    Ic1 is the first critical current,
    Ic2 is the second critical current,
    RS1 is a resistance value of the magnetoresistive device when current near the second critical current flows in the magnetoresistive device in the first resistance state,
    RS2 is a resistance value of the magnetoresistive device when current near the first critical current flows in the magnetoresistive device in the second resistance state,
    RL1 is differential resistance of the load resistance unit of the first state, and
    RL2 is differential resistance of the load resistance unit of the second state.

4. The memory according to claim 1, wherein the load resistance unit includes:
    a first resistance device;
    a second resistance device, differential resistance of the second resistance device being lower than differential resistance of the first resistance device; and
    a switching unit switching the load resistance unit to the first state by electrically connecting the first resistance device to the magnetoresistive device, the switching unit switching the load resistance unit to the second state by electrically connecting the second resistance device to the magnetoresistive device.

5. The memory according to claim 4, wherein
    the load resistance unit includes:
        a first terminal set to a first electric potential; and
        a second terminal set to a second electric potential,
    the absolute value of the first electric potential is higher than the absolute value of the second electric potential,
    the first resistance device is electrically connected to the first terminal, and
    the second resistance device is electrically connected to the second terminal.

6. The memory according to claim 4, wherein
    the load resistance unit includes:
        a first terminal set to a first electric potential; and
        a second terminal set to a second electric potential, the absolute value of the first electric potential is higher than the absolute value of the second electric potential, the first resistance device and the second resistance device are connected in parallel with the magnetoresistive device via the switching unit, and the load resistance unit is switched to the first state when the first terminal and the first resistance device are connected to the magnetoresistive device, and the load resistance unit is switched to the second state when the second terminal and the second resistance device are connected to the magnetoresistive device.

7. The memory according to claim 4, wherein the load resistance unit includes:
   a first terminal set to a first electric potential; and
   a second terminal set to a second electric potential, the absolute value of the first electric potential is higher than the absolute value of the second electric potential, the first resistance device is connected in series between the first terminal and the magnetoresistive device via the switching unit, the second resistance device is connected in parallel with the magnetoresistive device via the switching unit, and the load resistance unit is switched to the first state when the first terminal and the first resistance device are connected to the magnetoresistive device, and the load resistance unit is switched to the second state when the second terminal and the second resistance device are connected to the magnetoresistive device.

8. The memory according to claim 4, wherein the load resistance unit includes:
   a first terminal set to a first electric potential; and
   a second terminal set to a second electric potential, the absolute value of the first electric potential is higher than the absolute value of the second electric potential, the first resistance device is connected in parallel with the magnetoresistive device via the switching unit, the second resistance device is connected in series between the second terminal and the magnetoresistive device via the switching unit, and the load resistance unit is switched to the first state when the first terminal and the first resistance device are connected to the magnetoresistive device, and the load resistance unit is switched to the second state when the second terminal and the second resistance device are connected to the magnetoresistive device.

9. The memory according to claim 4, wherein the load resistance unit includes a first terminal set to a first electric potential, the first resistance device and the second resistance device are connected in parallel with the magnetoresistive device via the switching unit, and the load resistance unit is switched to the first state when the first terminal and the first resistance device are connected to the magnetoresistive device, and the load resistance unit is switched to the second state when the first terminal and the second resistance device are connected to the magnetoresistive device.

10. The memory according to claim 1, wherein the load resistance unit includes a MOSFET, a gate terminal and a drain terminal of the MOSFET being connected to each other.

11. The memory according to claim 10, comprising a pair of power supply terminals, the load resistance unit including a semiconductor device and a switching device, the magnetoresistive device being provided between the pair of power supply terminals, the semiconductor device being provided between the magnetoresistive device and one power supply terminal of the pair of power supply terminals, the MOSFET being provided in parallel with the semiconductor device between the one power supply terminal and the magnetoresistive device, the switching device being provided between the magnetoresistive device and the MOSFET, the load resistance unit being switched to the first state by switching the switching device to an OFF state and switching the semiconductor device to an ON state, the load resistance unit being switched to the second state by switching the semiconductor device to an OFF state and switching the switching device to an ON state.

12. The memory according to claim 1, wherein the load resistance unit includes a semiconductor device, the semiconductor device includes:
   a first electrode electrically connected to the magnetoresistive device;
   a second electrode; and
   a control electrode controlling current flowing between the first electrode and the second electrode, and the load resistance unit is switched to the first state when first control voltage is applied to the control electrode, and the load resistance unit is switched to the second state when second control voltage different from the first control voltage is applied to the control electrode.

13. The memory according to claim 1, wherein the load resistance unit includes:
   a first terminal electrically connected to a constant current source;
   a second terminal electrically connected to a constant voltage source; and
   a switching unit switching the load resistance unit to the first state by electrically connecting the first terminal to the magnetoresistive device, the switching unit switching the load resistance unit to the second state by electrically connecting the second terminal to the magnetoresistive device.

14. The memory according to claim 13, wherein the constant current source supplies current between $Ic1$ and $Ic2$, and the constant voltage source applies voltage between $Ic2 \times RS1$ and $Ic1 \times RS2$, where $Ic1$ is first critical current where the magnetoresistive device changes from the second resistance state to the first resistance state, $Ic2$ is second critical current where the magnetoresistive device changes from the first resistance state to the second resistance state, $RS1$ is a resistance value of the magnetoresistive device when current near the second critical current flows in the magnetoresistive device in the first resistance state, and $RS2$ is a resistance value of the magnetoresistive device when current near the first critical current flows in the magnetoresistive device in the second resistance state.

15. The memory according to claim 1, wherein the magnetoresistive device includes a nonmagnetic layer provided between the first ferromagnetic layer and the second ferromagnetic layer.

16. The memory according to claim 15, wherein the nonmagnetic layer includes an insulator.

17. The memory according to claim 15, wherein the nonmagnetic layer includes a conductor.

18. The memory according to claim 1, wherein
   the magnetoresistive device includes:

a semiconductor layer including a first semiconductor portion, a second semiconductor portion, and a third semiconductor portion, the third semiconductor portion being between the first semiconductor portion and the second semiconductor portion;

a gate electrode provided to face to the third semiconductor portion; and a gate insulator film provided between the third semiconductor portion and the gate electrode, the first ferromagnetic layer is provided to face to the first semiconductor portion, and the second ferromagnetic layer is provided to face to the second semiconductor portion.

19. The memory according to claim 18, wherein the magnetoresistive device includes an insulator provided between the first ferromagnetic layer and the first semiconductor portion and/or between the second ferromagnetic layer and the second semiconductor portion.

20. A semiconductor-integrated-circuit, comprising:

magnetoresistive devices, each of the magnetoresistive devices having a first resistance state and a second resistance state and including a first ferromagnetic layer and a second ferromagnetic layer, a direction of magnetization of the first ferromagnetic layer being changeable, a direction of magnetization of the second ferromagnetic layer being changeable, resistance between the first ferromagnetic layer and the second ferromagnetic layer being higher in the second resistance state than in the first resistance state; and a load resistance unit electrically connected to at least one of the magnetoresistive devices, the load resistance unit having a first state and a second state, differential resistance of the load resistance unit at the second state being lower than differential resistance of the load resistance unit at the first state; and a controller switching the at least one of the magnetoresistive devices to the first resistance state by current flowing in a first direction between the first ferromagnetic layer and the second ferromagnetic layer with the load resistance unit being set to the first state, the controller switching the at least one of the magnetoresistive devices to the second resistance state by current flowing in the first direction between the first ferromagnetic layer and the second ferromagnetic layer with the load resistance unit being set to the second state.

* * * * *